(12) United States Patent
Del Gatto

(10) Patent No.: US 11,468,948 B2
(45) Date of Patent: Oct. 11, 2022

(54) CLEANING MEMORY BLOCKS USING MULTIPLE TYPES OF WRITE OPERATIONS

(71) Applicant: Micron Technology, Inc., Boise, ID (US)

(72) Inventor: Nicola Del Gatto, Cassina de' Pecchi (IT)

(73) Assignee: Micron Technology, Inc., Boise, ID (US)

(*) Notice: Subject to any disclaimer, the term of this patent is extended or adjusted under 35 U.S.C. 154(b) by 39 days.

(21) Appl. No.: 17/153,597

(22) Filed: Jan. 20, 2021

(65) Prior Publication Data

US 2022/0230683 A1 Jul. 21, 2022

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 2013/0083* (2013.01)

(58) Field of Classification Search
CPC ............ G11C 13/0069; G11C 13/0004; G11C 2013/0083
USPC ......................................................... 365/163
See application file for complete search history.

(56) References Cited

U.S. PATENT DOCUMENTS

| 7,065,613 B1* | 6/2006 | Flake ................. G06F 12/0875 711/132 |
| 2017/0003964 A1* | 1/2017 | Bartik ................ G06F 9/30043 |

* cited by examiner

*Primary Examiner* — Vu A Le
(74) *Attorney, Agent, or Firm* — Holland & Hart LLP

(57) ABSTRACT

Methods, systems, and devices for cleaning memory blocks using multiple types of write operations are described. A counter may be incremented each time a write command is received. In response to the counter reaching a threshold, the counter may be reset and a flag may be set. Each time a cleaning of a memory block is to take place, the flag may be checked. If the flag is set, the memory block may be cleaned using a second type of cleaning operation, such as one using a force write approach. Otherwise, the memory block may be cleaned using a first type of cleaning operation, such as one using a normal write approach. Once set, the flag may be reset after one or more memory blocks are cleaned using the second type of cleaning operation.

25 Claims, 11 Drawing Sheets

CLEANING MEMORY BLOCKS USING MULTIPLE TYPES OF WRITE OPERATIONS

FIELD OF TECHNOLOGY

The following relates generally to one or more systems for memory and more specifically to cleaning memory blocks using multiple types of write operations.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
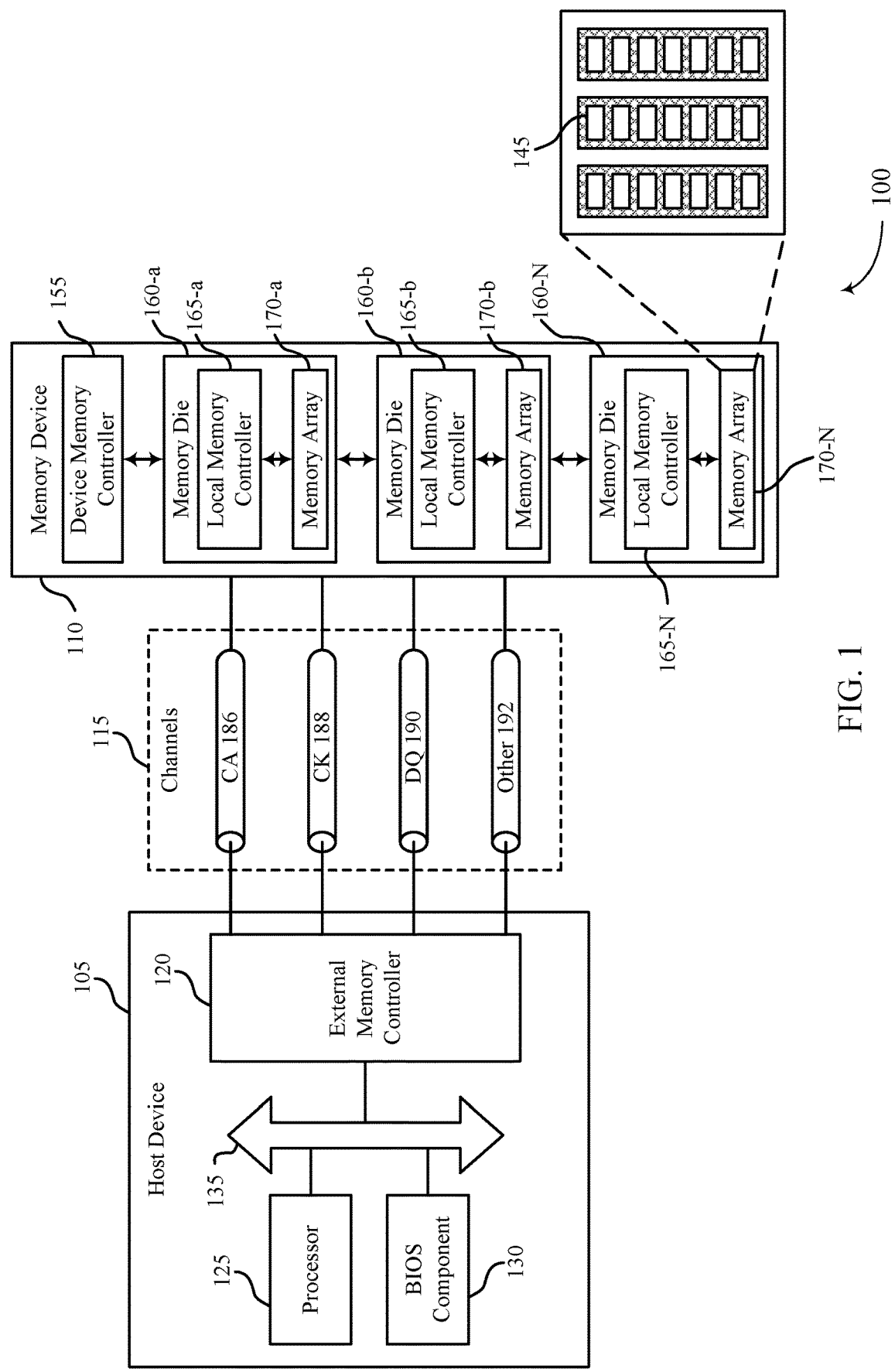
FIG. 1 illustrates an example of a system that supports cleaning memory blocks using multiple types of write operations in accordance with examples as disclosed herein.

In some examples, a memory device may write memory cells utilizing a first approach, which may be referred to herein as a "normal write" approach. In this approach, the memory device may subject a memory cell to a write (e.g., programming) operation if the logic state already stored by the memory cell is different than a target logic state but may otherwise refrain from subjecting the memory cell to a write operation. For example, if the memory device is to write a memory cell to a first logic state, the memory device may check whether the memory device is already storing the first logic state before potentially subjecting the memory cell to any write operation. If the memory cell is identified as storing a second logic state, the memory device may write the memory cell to the first logic state, but if the memory cell is identified as already storing the first logic state, the memory device may refrain from subjecting the memory cell to any write operation.

In other examples, a memory device may write memory cells utilizing a second approach, which may be referred to herein as a "force write" approach. In this approach, if a memory cell is subject to a write command, the memory device may subject the memory cell to a write operation irrespective of the logic state already stored by the memory cell. For example, if the memory device is to write a memory cell to a second logic state, the memory device may subject the memory cell to a write operation even if the memory cell already stores the second logic state. In some examples, performance tradeoffs may exist between the force write approach and the normal write approach—that is, each approach may have one or more advantages and disadvantages over the other.

In some examples, utilizing a normal write approach may save power and avoid additional wear-out on memory cells relative to a force write approach (e.g., because the normal write approach may avoid writing memory cells that are subject to a write command but already in a target state). That is, by reducing the quantity of times individual memory cells are written over a course of operation, the normal write approach may reduce wear-out of memory cells. Additionally, reducing the quantity of times individual memory cells are written over a course of operation may avoid disturbances of non-target memory cells that may otherwise occur due to other memory cells (e.g., neighbor memory cells) within a memory array being accessed, such as due to unselected memory cells experiencing an applied voltage due to being coupled with the same access line as an accessed memory.

For these or other reasons that may be appreciated by one of ordinary skill in the art, a normal write approach may be generally desired for programming memory cells and additionally or alternatively for cleaning (e.g., erasing) memory cells. As used herein, cleaning a set of memory cells may refer to writing each of the memory cells to a same state (e.g., logic value, such as a logic 0), which in some cases may render the set of memory cells ready (e.g., available) to be subsequently programed to store data.

Despite the one or more benefits of a normal write approach, due to endurance issues of the memory blocks, it may be desirable to occasionally subject a given memory cell to a write operation using a force write approach, as this may have various endurance-related benefits for the memory cell. Accordingly, as described herein, for every quantity N or approximately N (e.g., for every 100 or more) cleanings using a normal write approach, a memory cell may be cleaned using a force write approach. Systems, techniques, and devices are described herein that may utilize such a combination of normal writes and force writes for memory block cleanings, which may provide various endurance-related benefits or other benefits as may be appreciated by one of ordinary skill in the art.

Features of the disclosure are initially described in the context of memory systems, dies, and arrays as described with reference to FIGS. 1-3. Features of the disclosure are further described in the context of a list and methods that may employ the list as described with reference to FIGS. 4-7. These and other features of the disclosure are further illustrated by and described with reference to an apparatus diagram and flowcharts that relate to cleaning memory blocks using multiple types of write operations as described with references to FIGS. 8-11.

FIG. 1 illustrates an example of a system 100 that supports cleaning memory blocks using multiple types of write operations in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory device 110 including two or more memory dies may be referred to as a multi-die memory or a multi-die package or a multi-chip memory or a multi-chip package.

A memory array 170 may be a collection (e.g., one or more grids, one or more banks, one or more tiles, one or more sections) of memory cells, with each memory cell being operable to store at least one bit of data. Each memory array 170 may include one or more blocks 145, which as used herein may refer to a set of memory cells that may be written (e.g., programmed or cleaned) together (e.g., as part of a single write operation, concurrently).

In some cases, a block 145 may be the smallest unit of memory (e.g., set of memory cells) that may be independently written or cleaned (e.g., cleaned concurrently as part of a single clean—which may also be known as an erase operation). Further, in some cases, memory cells may not be re-written with new data until after they have been cleaned.

Different groups (e.g., blocks 145) of memory cells may have different physical addresses within a physical address space for the memory device 110. Different sets of data may be associated with different logical addresses within a logical address space, which may alternatively be referred to as a system address space or virtual address space, and which may be referenced by the host device 105 to identify the different sets of data (e.g., read or write commands from the host device 105 may indicate a corresponding set of data based on the logical address for the corresponding set of data). Thus, in some cases, each block 145 of memory cells may be configured to store a set of data corresponding to a respective logical block address (LBA).

Alternatively, in some cases, a group of blocks 145 may be associated with (e.g., configured to store a set of data corresponding to) a single respective LBA. For example, in some cases, the quantity of data stored by a single block 145 may be referred to as a page, and a single access command (e.g., read or write command) issued by the host device 105 (e.g., by the external memory controller 120) may be operable to access a single block 145, and the host device 105 may issue multiple access commands to access (e.g., read data from or write data to) the multiple blocks 145 associated with data having a particular LBA. In some case, the multiple blocks 145 are associated with a single LBA may be sequential, and the physical address of the first block 145 (e.g., according to some addressing or indexing scheme) may be considered the physical address of the group of blocks 145 corresponding to the single LBA (e.g., for logical-to-physical (L2P) mapping purposes, as discussed herein). Accordingly, references herein to operations occurring with respect to a memory block may alternatively occur with respect to a group of memory blocks in some implementations.

The memory device 110 or external memory controller 120 may store and maintain an L2P table indicating a mapping between the physical address space and a logical address space corresponding to the logical addresses. For example, the L2P table may indicate the physical address for the block 145 in which the data associated with each logical address is stored. In some cases, one or more copies of an L2P mapping table may be stored within the memory cells of the memory device 110 (e.g., within one or more blocks 145) for use (e.g., reference and updating) by a controller as described herein (e.g., external memory controller 120, device memory controller 155, or local memory controller 165).

In some cases, to update data associated with an LBA and previously written to a first block 145, a new (e.g. updated) version of the data may be written to a second block 145. A controller as described herein may mark or otherwise designate the data that remains in the first block 145 as invalid or obsolete, and may update the L2P mapping table to associate the logical address (e.g., LBA) for the data with the new, second block 145 rather than the old, first block 145. The prior (e.g., outdated) version of the data stored at the first block 145, and additionally or alternatively the first block 145 itself, may be referred to as invalid. Generally, invalid data may be data that is outdated due to a more recent or updated version of the data being stored in a different block 145 of the memory device 110. Invalid data may have been previously programmed to the invalid block 145 but may no longer be associated with a valid logical address, such as a logical address referenced by the host device 105. Valid data may be the most recent version of such data being stored on the memory device 110. A block 145 that includes no data may be a block 145 that has never been written to or that has been cleaned.

In some cases, a controller as described herein may perform operations (e.g., as part of one or more media management algorithms) for a memory device 110. For example, the controller may clean blocks 145 storing invalid data, rendering those blocks 145 available to subsequently be written to store new, valid data. In some cases, the controller may initiate one or more cleaning operations opportunistically (e.g., during idle periods in which operations commanded by the host device 105 are not being performed by the memory device 110). Additionally or alternative, the controller may initiate one or more cleaning operations opportunistically on a scheduled (e.g., periodic basis). As a result of one or more cleaning operations being performed on blocks 145 storing invalid data, the number of blocks 145 that have been cleaned may be increased such that more blocks 145 are available to store subsequent data (e.g., data subsequently received from the host device 105).

In some cases, a list (e.g., a physical block status (PBS) list, discussed below) may be used in conjunction with the L2P table to manage the usage and cleaning of the memory blocks 145 in accordance with examples as disclosed herein.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The system 100 may include non-transitory computer readable media that support cleaning memory blocks using multiple types of write operations. For example, the host device 105, a memory device 110, or a memory die 160 may include or may otherwise access one or more non-transitory computer readable media storing instructions (e.g., firmware) for performing the functions ascribed herein to the host device 105, memory device 110, or memory die 160. For example, such instructions, when executed by the host device 105, by a memory device 110 (e.g., by a device memory controller 155), or by a memory die 160 (e.g., by a local memory controller 165), may cause the host device 105, memory device 110, or memory die 160 to perform associated functions as described herein.

Figure 2:
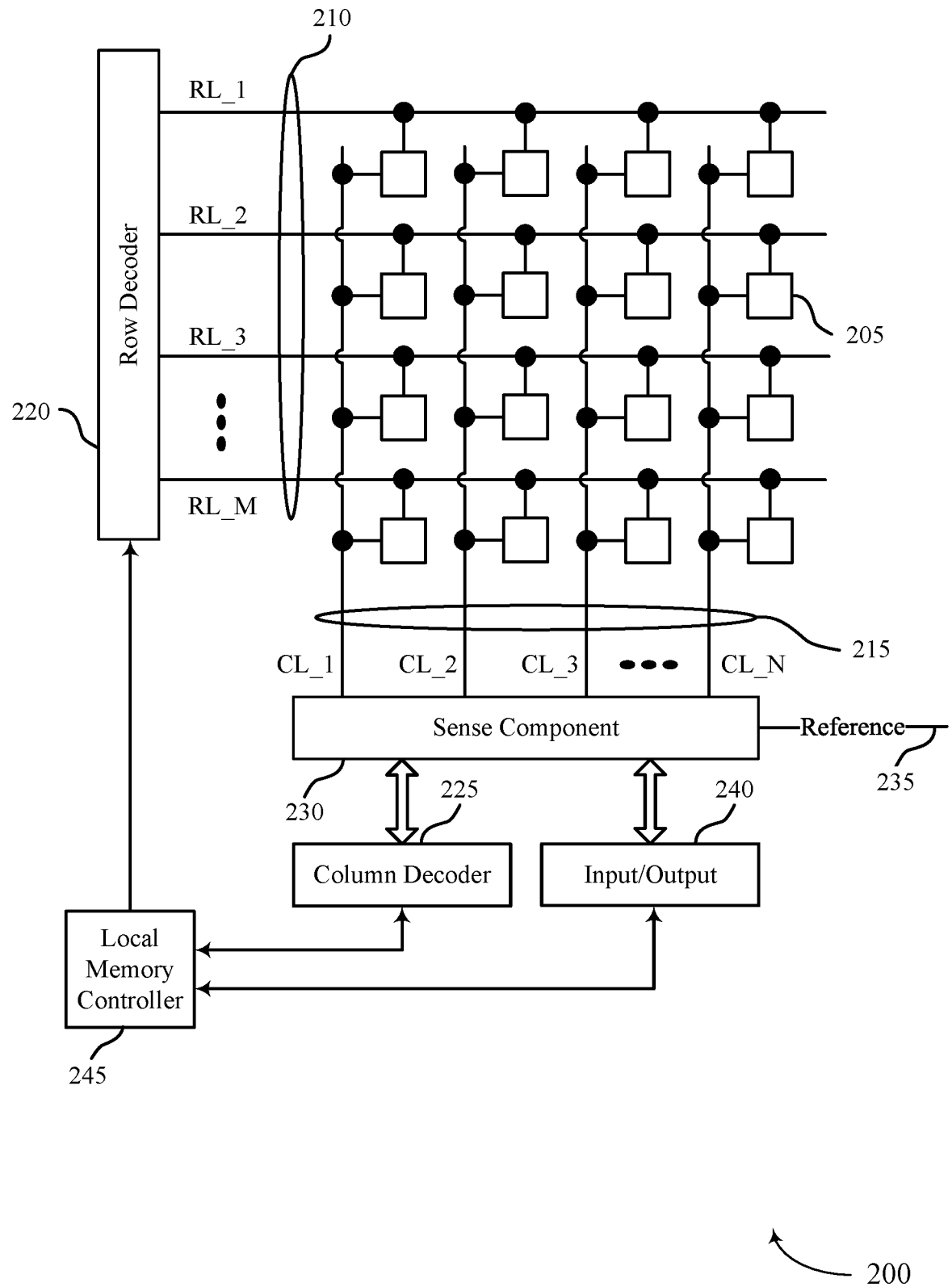
FIG. 2 illustrates an example of a memory die that supports cleaning memory blocks using multiple types of write operations in accordance with examples as disclosed herein.

FIG. 2 illustrates an example of a memory die 200 that supports cleaning memory blocks using multiple types of write operations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

In some examples, the local memory controller 245 may perform a write operation utilizing a normal write approach or a force write approach. If using the normal write approach, the local memory controller 245 may activate the sense component 230 (or a portion thereof) while applying a first pulse to determine a logic state of a memory cell 205. The local memory controller 245 may then apply a second pulse to write the memory cell 205 if the determined logic state is different than the target logic state, but may refrain from applying a second pulse to the memory cell 205 if the determined logic state is the same as the target logic state. If using the force write approach, the local memory controller 245 may write to a memory cell irrespective of the logic state stored at the memory cell. In some such cases, the local memory controller may deactivate the sense component 230 (or a portion thereof) or may not latch one or more signals generated by the sense component 230 during a portion of the write operation (e.g., while a first pulse included in the force write operation is applied).

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference 235. Based on that comparison, the sense component 230 may determine a logic state that is stored on the memory cell 205. The pulse used as part of the read operation may include one or more voltage levels over a duration.

Figure 3:
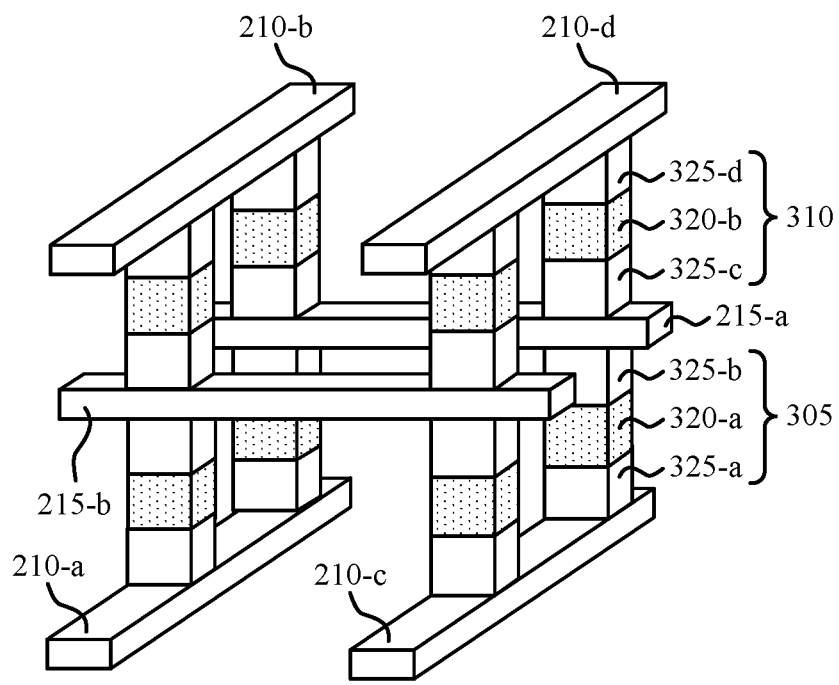
FIG. 3 illustrates an example of memory cells that support cleaning memory blocks using multiple types of write operations in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-a, storage element 320-a, electrode 325-b), the various parameters of the programming pulse may influence (e.g., determine, set, program) a particular behavior or characteristic of the material of the storage element 320, such as the threshold voltage of the material or the resistance of the material.

To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state.

To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state.

The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage if the material is storing a logic state '0' versus a logic state '1') may correspond to the read window of the storage element 320.

In some examples, memory cells in memory array 300 may be written (e.g., programmed) with a normal write approach. For example, a first pulse—which in some cases may be referred to as a pre-read pulse or alternatively as a drift cancellation pulse—may be applied to the memory cells to determine a logic state already stored by the memory cell. The first pulse may also mitigate drift in the threshold voltage of the memory cell since the memory cell was previously programmed. A second pulse—which in some cases may be referred to as a program pulse—may or may not then be applied to a given memory cell, depending on whether the logic state already stored by the memory cell differs from a target logic state for the memory cell. In other examples, memory cells may be written with a force write approach. For example, a program pulse may be applied to the memory cells irrespective of the logic states already stored by the memory cells, possibly following a drift cancellation pulse.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some examples a memory device may desire to write one or more memory cells to a reset state or a set state. In some cases, the memory device may utilize a normal write approach to achieve the reset or set state for the memory cells.

If implementing the normal write approach, the memory device may check whether any memory cells subject to the write command already store the target logic state (e.g., are already in the reset state). The memory device may write a memory cell if the memory cell is identified as storing a logic state other than the target logic state associated with the write operation (e.g., the memory device may write a memory cell to the reset state if the memory cell is identified as previously being in a set state or vice versa), and the memory device may refrain from writing a memory cell that is identified as already being in the target state (e.g., the memory device may refrain from writing a memory cell to the reset state if the memory cell is identified as already being in the reset state, or to the set state if the memory cell is identified as already being in the set state).

For example, if implementing a normal write approach, the memory device may first apply a drift cancellation (DC) pulse to each memory cell indicated by the write command to be placed into the target state. In some examples, the DC pulse may mitigate drift in threshold voltage that may occur over time for a previously programmed memory cell. As one example, after being programmed to a given state, the threshold voltage of a memory cell may drift due to read operations performed on the memory cell, as read operations may tend to push (e.g., shift) the threshold voltage of the memory cell toward a state associated with the polarity of a pulse used as part of a read operation. Additionally or alternatively, the threshold voltage of a memory cell may drift due to access (e.g., read or write) operations performed on other (e.g., neighboring) memory cells in the same memory array, as pulses applied to other memory cells may cause voltage fluctuations for access lines within the array that may push (e.g., shift) the threshold voltage of the memory cell toward one state or another. Additionally or alternatively, the threshold voltage of a memory cell may drift due simply to the passage of time after the memory cell is programmed. Application of the DC pulse may be applied to mitigate the drift accumulated on the memory cell and revert the memory cell to its previously written state before the drift occurred.

Additionally, the DC pulse may be used by the memory device to determine whether a memory cell is currently storing a logic state (e.g., the set state) different than the logic state associated with the write operation (e.g., the reset state). In some examples, such as where the memory cell comprises a chalcogenide material, as a voltage across the memory cell increases from zero to a value less than the threshold voltage of the memory cell, relatively little current may flow through the memory cell. That is, the memory cell may exhibit a relatively high resistance if the voltage across the memory cell is below the threshold voltage. In response to the voltage across the memory cells increasing from a voltage less than the threshold voltage to a voltage greater than the threshold voltage, the current through the memory cell may increase rapidly. As the current through the memory cell increases, the voltage across the memory cell may decrease until the voltage reaches an intermediate voltage between zero and the threshold voltage. That is, the memory cell may exhibit a negative resistance until the voltage across the memory cell reaches the intermediate voltage, which may be referred to as a snapback event. After the voltage across the memory cell reaches the intermediate voltage, the memory cell may exhibit a positive resistance again and the voltage across the cell may again gradually increase past the threshold voltage.

Thus, the DC pulse may have a magnitude in between a nominal threshold voltage associated with the set state and a nominal threshold voltage associated with the reset state (e.g., higher than the nominal threshold voltage associated with the set state, lower than the nominal threshold voltage associated with the reset state) so that memory cells in the set state may exhibit respective snapback events, but memory cells already in the reset state may not exhibit (e.g., experience, are detected as having) snapback events. Additionally, the DC pulse may be applied with an opposite polarity of the program pulse. In some cases, the observed threshold voltage of a memory cell may depend on the polarity of the voltage applied to the memory cell. Applying the DC pulse with the opposite polarity of the program pulse may help ensure that memory cells in a set state may exhibit snapback events and memory cells in a reset state do not. Determining the state of a memory cell using a DC pulse may also be referred to as a pre-read operation.

In some cases, the memory device may activate a snapback detection device, such as a sense component (e.g., sense component 230 as described with reference to FIG. 2) or a sense amplifier therein to detect whether a memory cell exhibits a snapback event while the DC pulse is applied. The snapback detection device may generate a signal indicative of whether the memory cell exhibits a snapback event. A latch may latch (e.g., store) an indication of whether the memory cell exhibits a snapback event based on the signal generated by the snapback detection device, which may also indicate the respective state of the memory cell at the time the DC pulse is applied.

After applying the DC pulse to the set of memory cells to be written to the reset state, the memory device may apply a program pulse to those memory cells that exhibit snapback events in response to the DC pulse. That is, if utilizing the normal write approach to program the reset state, the memory device may refrain from applying the program pulse to memory cells that do not exhibit snapback events, as those memory cells are already in the reset state. For a reset write operation, the program pulse may have a positive polarity.

Alternatively, after applying the DC pulse to the set of memory cells to be written to the set state, the memory device may apply a program pulse to those memory cells that do not exhibit snapback events in response to the DC pulse. That is, if utilizing the normal write approach to program the set state, the memory device may refrain from applying the program pulse to memory cells that exhibit snapback events, as those memory cells are already in the set state. For the set write operation, the program pulse may have a negative polarity.

It is to be understood that any reference to positive and negative polarities herein is solely for the sake of clarity in discussion and is not limiting of the claims—one of ordinary skill in the art will appreciate that what polarity of a pulse is considered positive versus negative in a given implementation may be arbitrary.

The force write approach may be similar to the normal write approach, but with the program pulse being applied to each memory cell regardless of whether the memory cell was already in the target state. For example, the memory device may apply the program pulse to all target memory cells to write them to the target state.

In some cases, the memory device may apply a DC pulse before the program pulse to mitigate drift, similar to the normal write approach. In some examples, if implementing the force write approach to write a memory cell to the target state, the memory device may refrain from detecting snapback events while applying the DC pulse. For example, the memory device may deactivate (or refrain from activating) the snapback detection device (e.g., sense component 230 or one or more sense amplifiers therein) to refrain from detecting snapback events that some memory cells subject to the DC pulse may exhibit. As another example, the memory device may refrain from latching signals generated by the snapback detection device (e.g., respective indications of the states of the memory cells subjected to the DC pulse).

Figure 4:
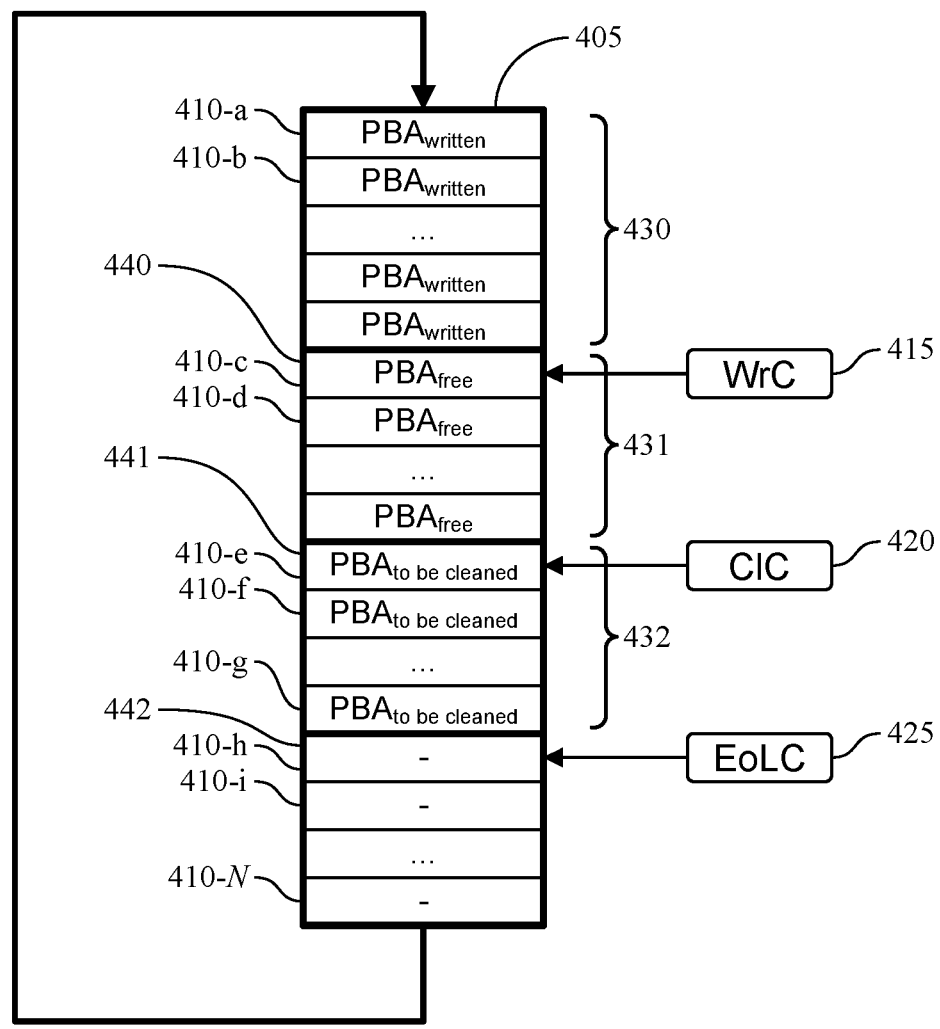
FIG. 4 illustrates an example of a list and associated controls that supports cleaning memory blocks using multiple types of write operations in accordance with examples as disclosed herein.

FIG. 4 illustrates an example of a list and associated controls 400 that support cleaning memory blocks using multiple types of write operations in accordance with examples as disclosed herein. The list and cursors may be implemented by a memory system or its components as described herein. For example, the table and associated components may be implemented by a memory system as described with reference to FIGS. 1 through 3. In some examples, the list and cursors may be used to perform methods (e.g., methods 500, 600, and 700) as disclosed herein.

The list and cursors may be used for physical block address management so as to lessen the wearing of the physical memory blocks. The list and cursors may be used to determine in what order the physical memory blocks should be written and cleaned.

The list 405 may have a plurality of positions 410 (e.g., 410-*a*, 410-*b*, . . . 410-N), beginning at a first position 410-*a* and ending at a last position 410-N. In some examples, list 405 may be a circular list, such that during use, the bottom of the list may wrap around to the top of the list. That is, once the last position 410-N is reached, the first position 410-*a* may be considered to be the next position in the list.

A physical address associated with one or more physical memory blocks (e.g., memory blocks 145 of FIG. 1) may be stored in each list position 410. As such, each list position 410 may be associated with a different physical memory block or group thereof. The list 405 may be used to manage the usage (e.g., writing to and cleaning of) the physical memory blocks. As such, the list 405 may be known as a physical block status (PBS) list.

To manage the list 405, a number of cursors may be used. The cursors and list 405 may be used to identify memory blocks that may (i) contain valid data, (ii) contain invalid data, and (iii) contain no data. The list 405 may also indicate an order in which the memory blocks may be used. For example, the list 405 may be used to determine an order in which the memory blocks may be written to and cleaned.

A write cursor (WrC) 415 may be used to determine a physical memory block to be used to store data associated with a newly received write command. The write cursor 415 may identify (e.g., point to) a "write" position 440 in the list (e.g., at position 410-*c*). In response to a write command being received (e.g., from a host), the data associated with the write command may be stored (e.g., written) to the memory block associated with the address stored in the write position 440. After the data has been written, the write cursor 415 may be updated (e.g., incremented) to identify the next position in the list (e.g., 410-*d*), which may become the new write position 440. In this manner, the write cursor 415 may be said to "move down to" the next position in the list. The address of the next memory block to be written may be contained in the new write position.

A cleaning cursor (ClC) 420 may be used to determine a physical memory block to be cleaned. The cleaning cursor 420 may identify (e.g., point to) a "cleaning" position 441 in the list (e.g., at position 410-*e*). The memory block associated with the address stored in the cleaning position 441 may be the next memory block containing invalid (e.g., out-of-date) data that is to be cleaned by erasing any data from the memory block (e.g., by writing one more cells of the memory block such that all cells within the memory block are set to same state or logic value). Once the memory block has been cleaned, the cleaning cursor 420 may be updated (e.g., incremented) to point to the next position in the list (e.g., 410-*f*), which may become the new cleaning position 441. In this manner, the cleaning cursor 420 may be said to "move down to" the next position in the list. The address of the next memory block to be cleaned may be contained in the new cleaning position.

An end-of-list cursor (EoLC) 425 may identify the end of the list of memory blocks to be cleaned (e.g., that contain invalid data). The end-of-list cursor 425 may identify (e.g., point to) an "end-of-list" position 442 in the list (e.g., at position 410-*h*) that may be available for storing an address of the next physical memory block whose data becomes invalid. In some cases, the list position directly before the end-of-list position 442 (e.g., position 410-*g*) may include an address of a physical memory block whose data has already been invalidated. When a physical memory block becomes invalidated (e.g., the data stored by the block becomes out of date or otherwise invalid), the address of the invalidated memory block may be written to the end-of-list position 442 and the end-of-list cursor 425 may be updated (e.g., incremented) to point to the next position in the list (e.g., 410-*i*), which may subsequently be used to store the address of the next physical memory block to become invalidated. This new position (e.g., 410-*i*) may become the new end-of-list position 442.

For example, when a write command for data associated with an LBA is received, the data may be written to a first memory block whose address is pointed to (e.g., indicated by) the write cursor 415. In some cases, an L2P table my be checked, and if the LBA is already included in the L2P table, this may be an indication that data associated with the LBA has previously been written to a second memory block that is associated with the LBA by the L2P table. The data stored to the second memory block (e.g., the previously written and now outdated version of the data) may thus have been rendered invalid by the new data associated with the newly received write command, and accordingly, the address of the second memory block may be written to the position pointed to (e.g., indicated by) the end-of-list cursor 425. Additionally, the L2P table may be updated to associated the first memory block to which the new data is written with the LBA (rather than the second memory block previously associated with the LBA).

During operation, the cursors 415, 420, and 425 may each independently move down through the list 405. Once a cursor may reach the bottom of the list 405, the cursor may be updated to point to the first position of the list 405. As the write cursor 415 may move down through the list, the memory blocks associated with the list positions above the current write cursor position 440 (e.g., group 430) may have been written and may contain valid data. As the cleaning cursor 420 may move down through the list, the memory blocks associated with the list positions above the current cleaning cursor position 441 (e.g., group 431) may have been cleaned (e.g., erased) and contain no data. As the end-of-list cursor 425 may move down through the list, the memory blocks associated with the list positions above the end-of-list position 442 (e.g., group 432) may contain invalid data (e.g., out-of-date data).

In some cases, memory blocks may be erased (cleaned) before being re-written. In those cases, the write cursor 415 may not reach or pass the cleaning cursor 420. In some cases, it may not be desirable to erase memory blocks containing valid data. Thus, the cleaning cursor 420 may not reach or pass the end-of-list cursor 425. In light of this, the memory blocks associated with the positions between the cleaning position 441 and the end-of-list position 442 (e.g., group 432) may contain invalid data and may be ready to be cleaned, the memory blocks associated with the positions between the write position 440 and the cleaning position 441 (e.g., group 431) may already be clean and thus be ready to be rewritten, and the memory blocks associated with the positions between the write position 440 and the end-of-list position 442 or some other starting position (e.g., group 430) may contain valid data.

Figure 5:
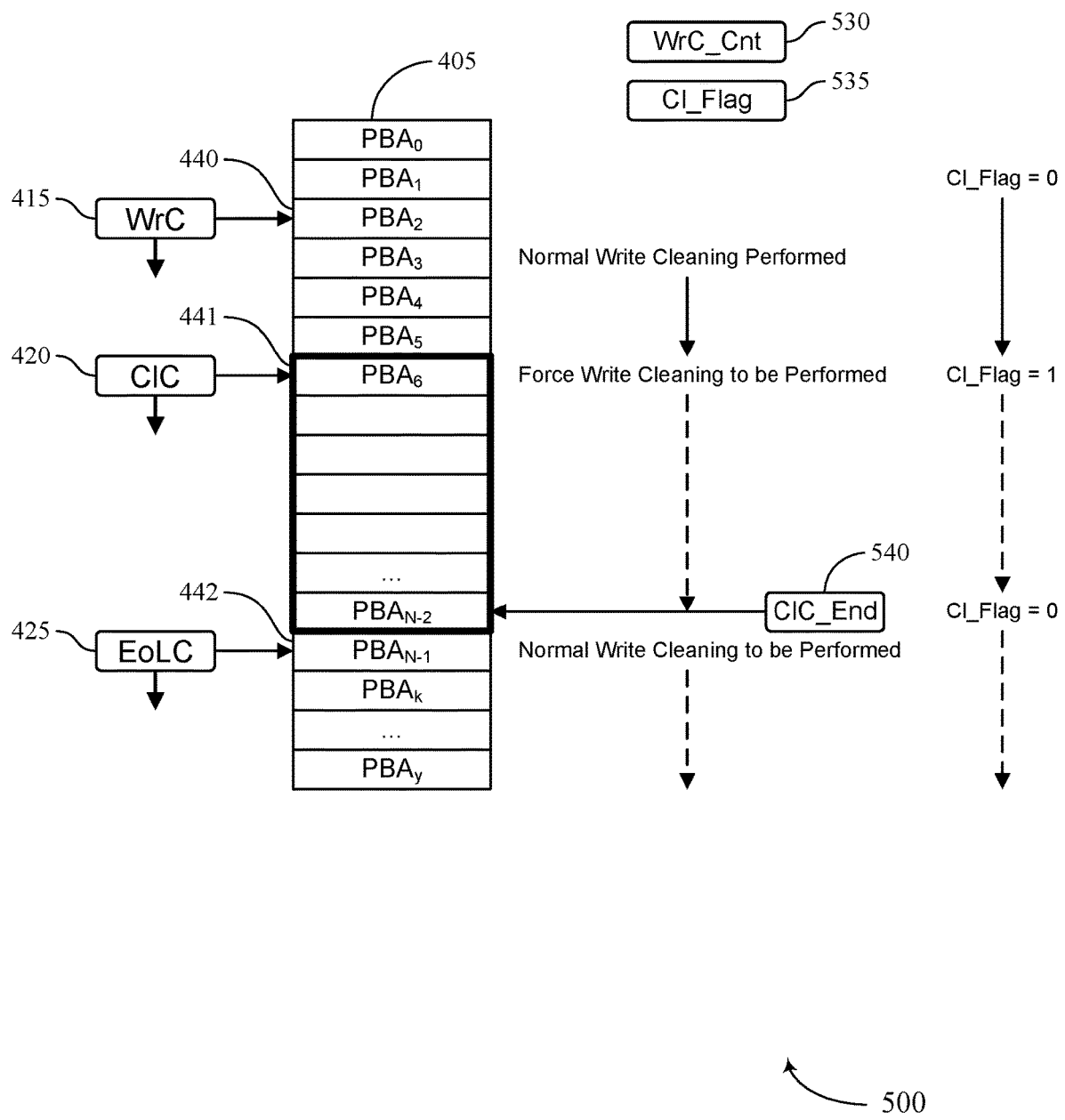
FIG. 5 illustrates an example of a method that supports cleaning memory blocks using multiple types of write operations in accordance with examples as disclosed herein.

FIG. 5 illustrates an example of a method 500 that supports cleaning memory blocks using multiple types of write operations in accordance with examples as disclosed herein. The operations of method 500 may be implemented by a memory system or its components as described herein. For example, the operations of method 500 may be performed by a memory system as described with reference to FIGS. 1 through 4. For example, aspects of the method 500 may be implemented by one or more controllers as described herein, among other components. Additionally or alternatively, aspects of the method 500 may be implemented as instructions stored in memory (e.g., firmware stored in a memory coupled with a controller). For example, the instructions, when executed by the controller may cause the controller to perform one or more operations of the method 500.

Using method 500, memory block cleanings using different approaches may be performed over the course of memory device operation. In addition, using method 500, a second type of cleaning (e.g., using a force write approach) may be used at set intervals after some target quantity of cleanings (or approximately the target quantity) have been performed using a first type of cleaning (e.g., using a normal write approach).

Method 500 may employ list 405 and write cursor 415, cleaning cursor 420, and end-of-list cursor 425. In some examples, a write counter (WrC_Cnt) 530, a cleaning flag (Cl_Flag) 535, and a cleaning-end pointer (ClC_End) 540 may also be used to help determine a type of write operation to be used for a particular cleaning operation for a memory block. The write counter 530 may be used to indicate the number of write operations performed. The cleaning flag 535 may identify the type of cleaning (e.g., first or second type) to use. The cleaning-end pointer 540 may point to the list position at which the second type of cleaning may end. The write counter 530 may be initialized to zero and the cleaning flag 535 may be initialized to a not-set state (e.g., be reset to "0").

If the cleaning flag is not set (e.g., is in a reset state, has a first logic value such as logic 0 for example), memory blocks may be cleaned using a first type of cleaning operation (e.g., using normal write to erase the memory cells). In response to a command being received and a corresponding write operation of a memory block being performed, the write counter 530 may be incremented and compared with a threshold. In some examples, the threshold may be related to the number of positions in the list 405. For example, the threshold may be equal to N*P, where N is a desired ratio of the number of times an individual memory block is cleaned using the first type of cleaning (e.g., using a normal write approach) to the number of times the memory block is cleaned using the second type of cleaning (e.g., using a force write approach) over some duration of operating the memory device (e.g., over a lifetime of the memory device or over some other duration sufficiently long for the memory block to be cleaned N or more times), and P is the total number of positions in the list. In some examples, the threshold may be related to the number of available addresses within the list. For example, the threshold may be equal to N*distance (EoLC, WrC), where distance (EoLC, WrC) is the number of positions in the list between the positions associated with the end-of-list cursor and the write cursor. N may be any desired threshold value. For example, N may be set to 100, 200, 400, or any other desired ratio of the number of cleanings using the first type of cleanings to the number of cleanings using the second type of cleanings.

In response to the value of the write counter 530 reaching the threshold, the cleaning flag 535 may be set (e.g., may come to have a second logic value, such as logic 1 for example) to trigger the use of a second type of memory block cleaning (e.g., using force write to erase the memory cells). The write counter 530 may also be reset (e.g., set back to zero) and the cleaning-end pointer 540 may be caused to point to the position in the list that is, at the time, directly before the end-of-list position identified by the end-of-list cursor 425. Regardless of whether the threshold is reached, write cursor 415 may be incremented to point to the next write position in the list after each write operation.

Independently, if a cleaning of a memory block is to be performed, the type of cleaning to use may be determined.

The type of cleaning may be based on the cleaning flag 535. In some examples, a first type of cleaning may be used if the cleaning flag is not set, and a second type of cleaning may be used if the cleaning flag may be set. In some examples, the first and second types of cleaning operation may respectively correspond to cleanings using first and second types of write operations. In some examples the first type of write operation may correspond to a normal write operation and the second type of write operation may correspond to a force write operation. After each memory block cleaning, cleaning cursor 420 may be incremented to point to the next cleaning position in the list.

After the cleaning flag 535 has been set, the cleaning-end pointer 540 may be used to determine to reset the cleaning flag. In some examples, the cleaning flag 535 may be reset (e.g., set to "0") in response to the cleaning cursor 420 reaching the list position pointed to by the cleaning-end pointer 540. Although the end-of-list cursor 525 may continue to move down through the list 405, the cleaning-end pointer 540 may continue to point to the same position in the list 405 until the cleaning flag 535 is reset.

Using FIG. 5, an example will now be given. Initially, the cleaning flag 535 may not be set and the write counter 530 may be set to zero. As write operations of memory blocks may be performed, the write cursor 415 may move down through the list 405. With each write operation, the write counter 530 may be incremented and the value compared with the threshold. As long as the write counter 530 remains below the threshold, the cleaning flag 535 may remain unchanged (e.g., unset).

Concurrently, as cleanings of memory blocks may be performed, the cleaning cursor 420 may also move down through the list 405, staying ahead of the write cursor 415. Before each cleaning, the type of cleaning to be used may be determined based on the value of the cleaning flag 535. As long as the value of the write counter 530 remains below the threshold, the cleaning flag 535 may remain unset. Because of this, the memory blocks may be cleaned using a first type of cleaning (e.g. using a normal write approach).

At some point, the write counter 530 may be incremented such that the value of the write counter 530 may reach the threshold. At that point, the method may set the cleaning flag 535 (e.g., set to "1") and reset the write counter 530 (e.g., set to zero). The method may also cause the cleaning-end pointer 540 to point to (e.g., store or otherwise reflect) the position in the list that is, at that time, directly before the end-of-list position 442 identified by the end-of-list cursor 425. FIG. 5 may reflect the positions of the write cursor 415, the cleaning cursor 420, the end-of-list cursor 425, and the cleaning-end pointer 540 as of a time that the value of the write counter 530 reaches the threshold.

Because the cleaning flag 535 may now be set, a second type of cleaning (e.g., using a force write approach) may be used to clean the next memory block that is cleaned. As the cleaning cursor 420 moves down through the list 405, the second type of cleaning may be used to clean the corresponding memory blocks. This may continue until the cleaning position 441 identified by the cleaning cursor 420 reaches the list position indicated by the cleaning-end pointer 540. At that point, the cleaning flag 535 may be reset (e.g., set to "0") so that the first type of cleaning may again be used for future cleanings. In some examples, the method may also reset the write counter 530 (e.g., set it to zero).

The write counter 530 and the cleaning flag 535 may be back to their initial values. As such, the method may be repeated with those values until the value of the write counter 530 again reaches the threshold. This loop may continue as long as desired.

Figure 6:
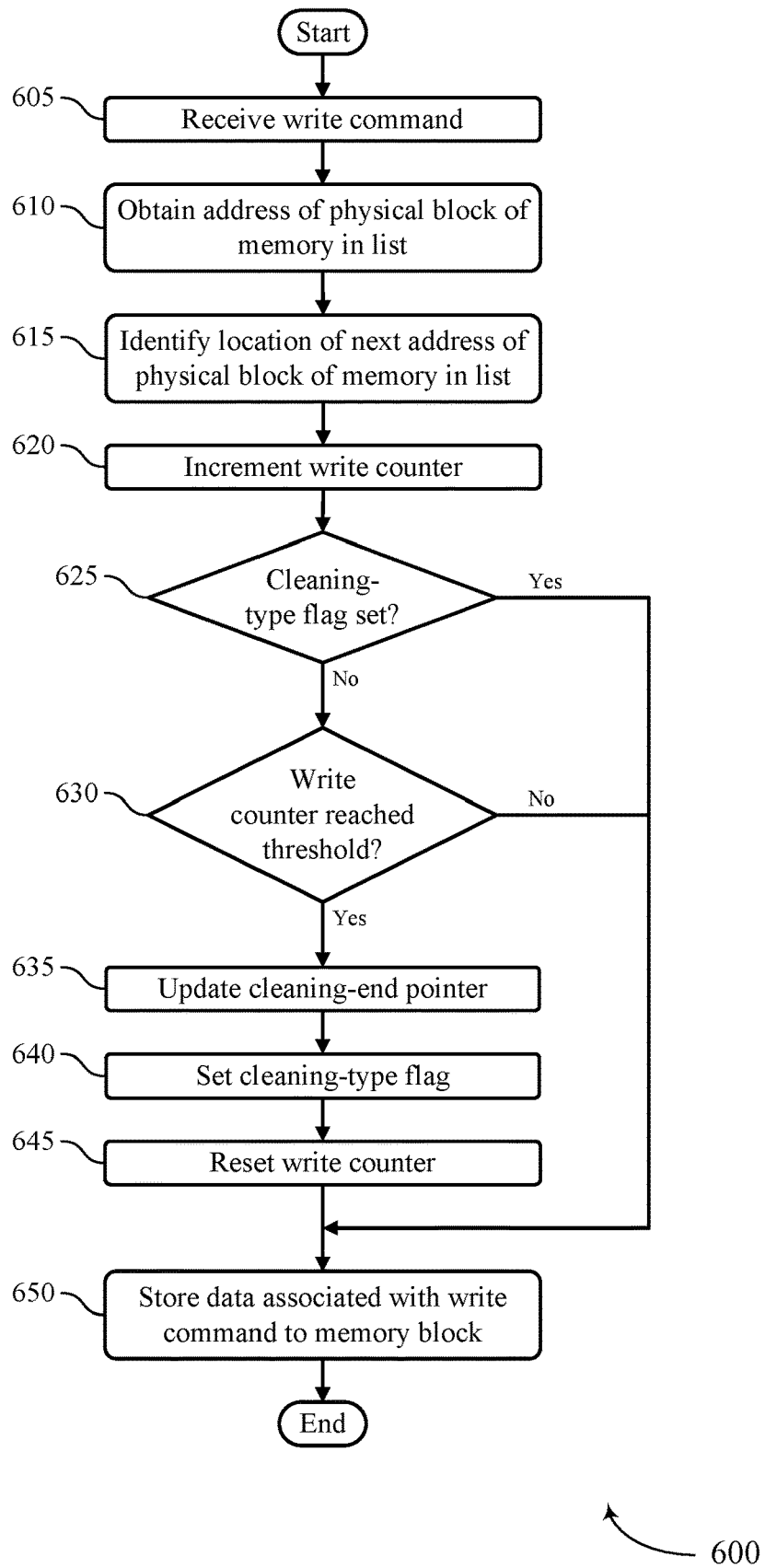
FIGS. 6 and 7 show flowcharts illustrating methods that support cleaning memory blocks using multiple types of write operations in accordance with examples as disclosed herein.

FIG. 6 is a flowchart illustrating a method 600 that supports cleaning memory blocks using multiple types of write operations in accordance with examples as disclosed herein. The operations of method 600 may be implemented by a memory system or its components as described herein. For example, aspects of method 600 may be implemented by an interface controller, among other components. In some examples, a memory system may execute a set of instructions to control the functional elements of the system to perform the described functions. Additionally or alternatively, aspects of method 600 may be implemented as instructions stored in memory (e.g., firmware stored in a memory coupled with memory device 110). For example, the instructions, when executed by a controller (e.g., a device memory controller 155, or a local memory controller 165), may cause the controller to perform the operations of method 600. Additionally or alternatively, the memory system may perform aspects of the described functions using special-purpose hardware.

In some examples, method 600 may be performed every time a write command is received by the memory device (e.g., from a host). Method 600 may be used in conjunction with a physical block status list and the control components thereof. For example, method 600 may be used with the list and components discussed with reference to FIGS. 4 and 5.

In general, in response to a write command being received, a counter may be incremented and compared to a threshold. If the counter has reached the threshold and a cleaning flag is not already set, the cleaning flag may be set, the counter may be reset, and a write operation may be performed. If the threshold has not been reached or the cleaning flag is already set, the write operation may be performed without resetting the counter or setting the cleaning flag.

At 605, a write command may be received (e.g., from a host device). The write command may indicate that associated data is to be written to a block of memory.

At 610, to determine the memory block to use to store the data, a memory block address may be obtained. In some examples, the address may be obtained from a list of memory block addresses (e.g., list 405). A write cursor (e.g., write cursor 415) may be used to determine which address in the list to use. The write cursor may identify (or point to) the position in the list where the memory block address is stored. The address may be obtained by using the write pointer as an offset into the list. The memory block associated with the identified address may be earmarked for the write operation.

At 615, a location of a next memory block address may be identified. In some examples, the write cursor may be updated (e.g., incremented) to identify (or point to) the next position in the list. An address of a next memory block for writing may be stored in that list position.

At 620, a write counter (e.g., write counter 530) may be incremented. The write counter may reflect a number of times any of the memory blocks associated with the list may have been used for write operations since the write counter was initiated or reset.

At 625, it may be determined whether a cleaning flag (e.g., cleaning flag 535) may be set. In some examples, the flag may be considered to be set if it equals a "1". In some examples, the flag may be considered to be set if it equals a "0". If the flag is not set, the method may continue to 630 to determine if the value of the write counter has reached a threshold. Otherwise, if the flag is set, the method may continue to 650 to perform the write operation.

At 630, the value of the write counter may be compared to a threshold to determine whether the value has reached the threshold. In some examples, the threshold may be based on the number of address positions in the list. In some examples, the threshold may be equal to the number of addresses in the list times a predetermined number. The threshold may be any desired amount as discussed herein. If the write counter value has reached the threshold, the method may continue to 635. Otherwise, if the write counter value has not reached the threshold, the method may continue to 650 to store the data associated with the write operation.

Although 625 is shown as being performed before 630, in some examples 630 may be performed before 625. In those cases, the write counter value may be compared to the threshold before determining whether the cleaning flag is set. In some examples, 625 and 630 may be combined into a single step. That is, the cleaning flag and the write counter value may be checked at the same time. Regardless of the order, the method may continue to 635 if the flag may not be set, and the write counter may have reached the threshold. If either of these two conditions may not have been met, the method may continue to 650.

At 635, a cleaning-end pointer (e.g., cleaning-end pointer 540) may be updated to identify or point to a position in the list. In some examples, the cleaning-end pointer may be updated to identify the position then identified by an end-of-list cursor (e.g., end-of-list cursor 425). In some examples, the cleaning-end pointer may be updated to instead identify the position in the list that is one position before the position identified (or pointed to) by the end-of-list cursor.

At 640, the cleaning flag may be set. In some examples, this may include setting the flag to a "1". In some examples, this may include setting the flag to a "0". In some examples, setting the cleaning flag may be a signal to a cleaning operation to begin using a second type of cleaning operation. In some examples, the cleaning flag may be reset by a separate, independent method (e.g., upon completion of one or more cleaning operations, as discussed with reference to FIG. 7).

At 645, the write counter (e.g., write counter 530) may be reset. This may include setting the write counter to zero.

At 650, data associated with the write command received at 605 (e.g., data received from the host device), may be stored (e.g., written) to the memory block associated with the address obtained at 610.

Figure 7:
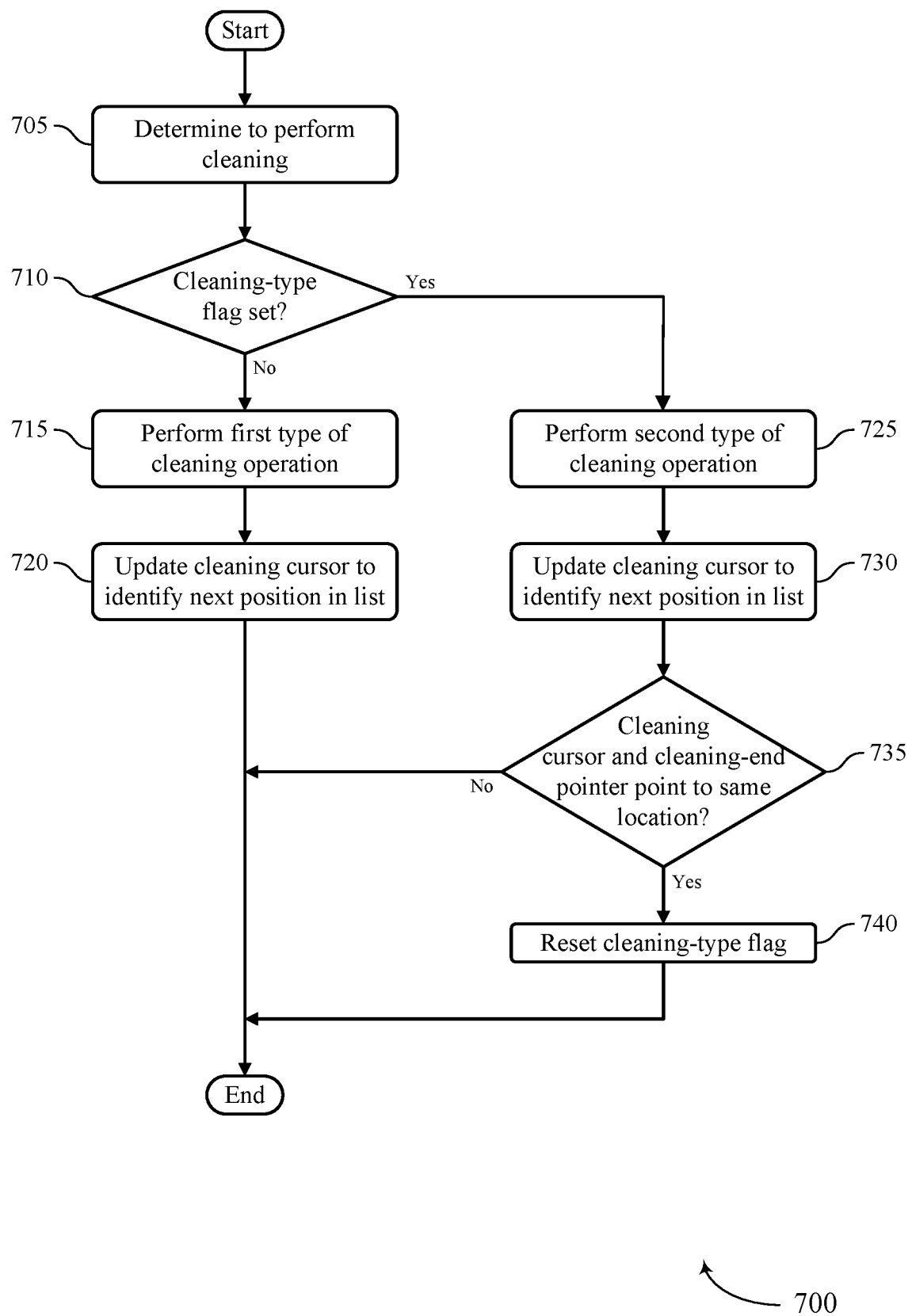

FIG. 7 is a flowchart illustrating a method 700 that supports cleaning memory blocks using multiple types of write operations in accordance with examples as disclosed herein. The operations of method 700 may be implemented by a memory device or its components as described herein. For example, aspects of method 700 may be implemented by an interface controller, among other components. In some examples, a memory device may execute a set of instructions to control the functional elements of the device to perform the described functions. Additionally or alternatively, aspects of method 700 may be implemented as instructions stored in memory (e.g., firmware stored in a memory coupled with memory device 110). For example, the instructions, when executed by a controller (e.g., a device memory controller 155, or a local memory controller 165), may cause the controller to perform the operations of method 700. Additionally or alternatively, the memory device may perform aspects of the described functions using special-purpose hardware.

In some examples, method 700 may be performed every time a cleaning is to be performed on a memory block. Method 700 may be used in conjunction with a physical block status list and the control components thereof. For example, method 600 may be used with the list and components discussed with reference to FIGS. 4 and 5.

In general, upon determining to clean a memory block, the value of a cleaning flag may first be checked. The memory block may be cleaned using a particular type of cleaning, based on the value of the cleaning flag. Upon cleaning of the memory block, a cleaning cursor may be incremented and, if the flag is set, may be compared to a cleaning-end pointer. If the cleaning cursor points to the same list location as the cleaning-end pointer, the cleaning flag may be reset.

At 705 it may be determined to clean a memory block. In some examples a command may be received to perform the cleaning (e.g., from a host device or from a memory controller). In some examples, the determination may be made without receiving a command.

At 710, a value of a cleaning flag (e.g., cleaning flag 535) may be identified. The value of the flag may indicate a type of write operation to use for cleaning the memory block. In some examples, the cleaning flag may either be in a set state or a reset state. In some examples, the flag may be considered to be set if it equals a "1" and reset if it equals a "0". In other examples, the flag may be considered to be set if it equals a "0" and reset if it equals a "1". In some examples, the flag may be independently programmed to a set state by a separate, independent, method (e.g., at 640 of method 600). Based on the value of the flag, the method may continue to either 715 (if the flag is not set) or 725 (if the flag is set) to perform a cleaning operation using a particular type of write operation.

At 715, because the cleaning flag may not be set, a first type of cleaning operation may be performed on a memory block. In some examples, the address of the memory block may be obtained from a list (e.g., list 405) using a cleaning cursor (e.g., using cleaning cursor 420). The cleaning cursor may identify (or point to) the position in the list where the address of the memory block may be stored. The address may be obtained by using the cleaning cursor as an offset into the list, e.g., in the manner discussed with respect to FIG. 4. In some examples, the first type of cleaning operation may be a cleaning using a first type of write operation. In some examples the first type of write operation may be a normal write operation. In those cases, the memory cells of the memory block may be cleaned (e.g., erased or programmed to a reset state) using a normal write operation as discussed herein.

At 720, the cleaning cursor may be updated (e.g., incremented) to identify (or point to) the next position in the list. An address of the next memory block to be cleaned may be stored in that list position.

At 725, because the cleaning flag may be set, a second type of cleaning operation may be performed on the memory block. Similar to 715, the memory block may be determined using the cleaning cursor and the list. In some examples, the second type of cleaning operation may be a cleaning using a second type of write operation. In some examples the second type of write operation may be a force write operation. In those cases, the memory cells of the memory block may be cleaned (e.g., erased or programmed to a reset state) using a force write operation as discussed herein.

At 730, the cleaning cursor may be updated (e.g., incremented) to identify (or point to) the next position in the list, e.g., in the same manner discussed at 720.

At 735, because the cleaning flag may be set, the cleaning cursor may be compared with a cleaning-end pointer (e.g. cleaning-end pointer 540) to determine if the cursor and pointer both identify (or point to) the same position in the list. In some examples, the cleaning-end pointer may be set up to identify (or point to) a position in the list by a separate, independent method (e.g., at 635 of method 600). If the cleaning cursor and the cleaning-end pointer identify the same list position, the method may continue to 740. Otherwise the method may bypass 740.

At 740, the cleaning flag may be reset (e.g., programmed to an unset state). This may signify that the first type of cleaning operation may be used for the next memory block to be cleaned and for the memory blocks thereafter until the cleaning flag may be set again (e.g., by method 600, discussed above).

In some examples, methods 600 and 700 may be used in conjunction with each other to determine whether to clean a memory block using the first or second type of cleaning operations. For example, method 600 may be used to set the cleaning flag and to set up the cleaning-end pointer and method 700 may be used to reset the cleaning flag in response to the position pointed to by the cleaning-end pointer being reached by the cleaning cursor.

Figure 8:
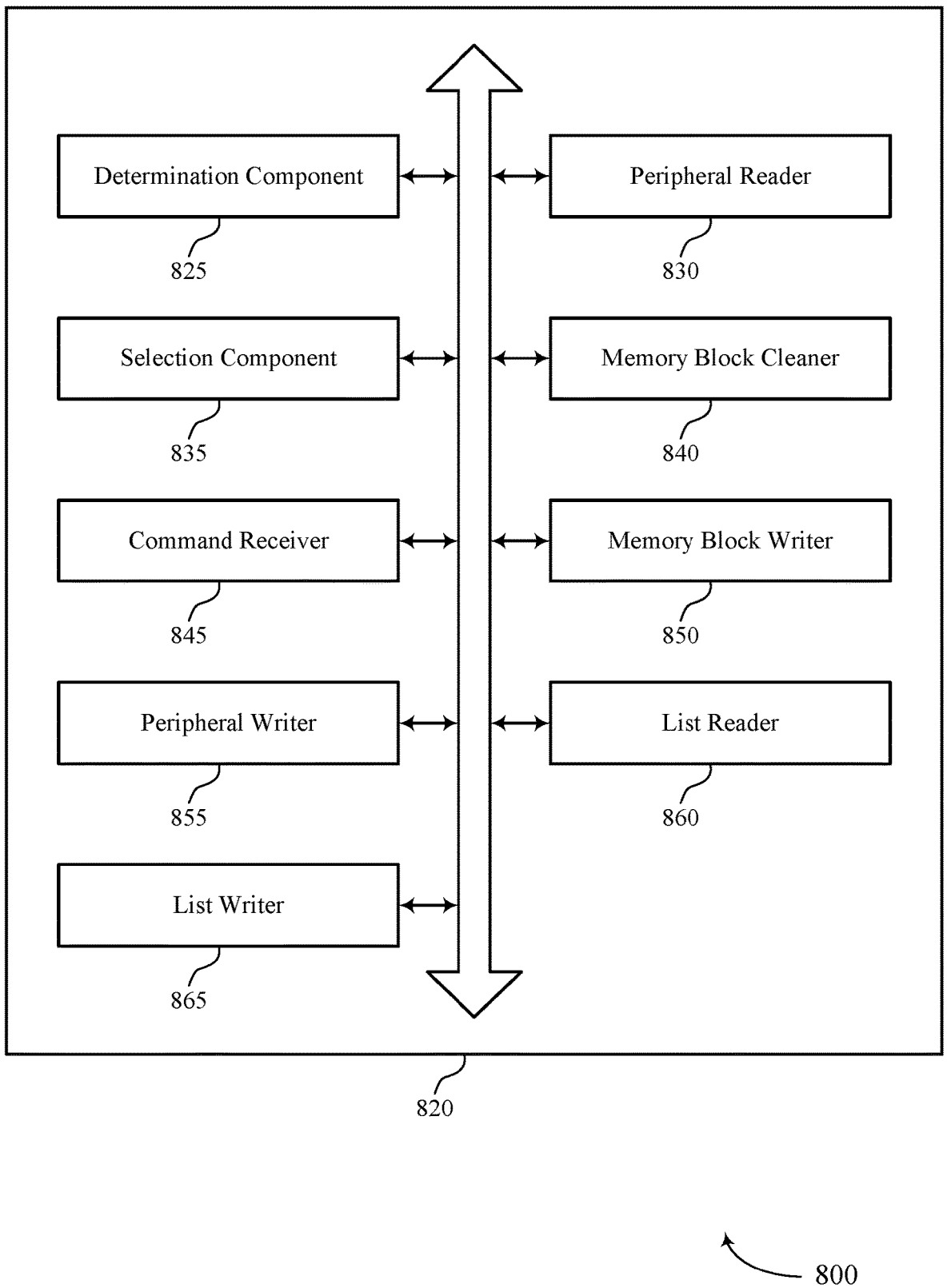
FIG. 8 shows a block diagram of a memory system that supports cleaning memory blocks using multiple types of write operations in accordance with examples as disclosed herein.

FIG. 8 shows a block diagram 800 of a memory system 820 that supports cleaning memory blocks using multiple types of write operations in accordance with examples as disclosed herein. The memory system 820 may be an example of aspects of a memory system as described with reference to FIGS. 1 through 7. The memory system 820, or various components thereof, may be an example of means for performing various aspects of cleaning memory blocks using multiple types of write operations as described herein. For example, the memory system 820 may include a determination component 825, a peripheral reader 830, a selection component 835, a memory block cleaner 840, a command receiver 845, a memory block writer 850, a peripheral writer 855, a list reader 860, a list writer 865, or any combination thereof. Each of these components may communicate, directly or indirectly, with one another (e.g., via one or more buses).

The determination component 825 may be configured as or otherwise support a means for determining to clean a memory block that includes a set of memory cells, the memory block included in a set of memory blocks that each include a respective set of memory cells. The peripheral reader 830 may be configured as or otherwise support a means for identifying a value of a flag based at least in part on determining to clean the memory block, where the value of the flag may indicate a type of write operation for cleaning one or more memory blocks of the set of memory blocks. The selection component 835 may be configured as or otherwise support a means for selecting a type of write operation to use to clean the memory block based at least in part on the value of the flag, the type being selected from among a set of types that includes a first type of write operation and a second type of write operation. The memory block cleaner 840 may be configured as or otherwise support a means for cleaning the memory block using the selected type of write operation.

In some examples, cleaning the memory block may result in each memory cell within the memory block being in the same state. In some examples, the memory block may be available to store new data based at least in part on being cleaned.

In some examples, to support selecting the type of write operation, the selection component 835 may be configured as or otherwise support a means for selecting the first type of write operation.

In some examples, to support cleaning the memory block, the memory block cleaner 840 may be configured as or otherwise support a means for identifying, within the set of memory cells, a subset of memory cells that are each in a first state. In some examples, to support cleaning the memory block, the memory block cleaner 840 may be configured as or otherwise support a means for writing each memory cell within the subset of memory cells to a second state.

In some examples, to support cleaning the memory block, the memory block cleaner 840 may be configured as or otherwise support a means for applying a first pulse having a first polarity to the set of memory cells.

In some examples, to support writing each memory cell within the subset of memory cells to the second state, the memory block cleaner 840 may be configured as or otherwise support a means for applying a second pulse having a second polarity to each memory cell within the subset of memory cells.

In some examples, identifying the subset of memory cells may be based at least in part on applying the first pulse.

In some examples, to support cleaning the memory block, the memory block cleaner 840 may be configured as or otherwise support a means for identifying within the set of memory cells, a second subset of memory cells that are each in the second state. In some examples, to support cleaning the memory block, the memory block cleaner 840 may be configured as or otherwise support a means for refraining from writing each memory cell within the second subset of memory cells.

In some examples, to support selecting the type of write operation, the selection component 835 may be configured as or otherwise support a means for selecting the second type of write operation.

In some examples, the peripheral writer 855 may be configured as or otherwise support a means for changing, after the cleaning of the memory block, the value of the flag to correspond to the first type of write operation.

In some examples, to support selecting the type of write operation, the selection component 835 may be configured as or otherwise support a means for selecting the second type of write operation.

In some examples, to support cleaning the memory block, the memory block cleaner 840 may be configured as or otherwise support a means for writing each memory cell within the set of memory cells to a second state regardless of whether the memory cell was already in the second state before the writing.

In some examples, to support cleaning the memory block, the memory block cleaner 840 may be configured as or otherwise support a means for applying a first pulse having a first polarity to each memory cell within the set of memory cells.

In some examples, to support writing each memory cell of the set of memory cells to a second state, the memory block cleaner 840 may be configured as or otherwise support a means for applying a second pulse to each memory cell within the subset of memory cells after applying the first pulse, the second pulse having a second polarity different than the first polarity.

In some examples, the list reader 860 may be configured as or otherwise support a means for obtaining an address of the memory block from a list of addresses of memory blocks. In some examples, the address may be obtained from a position in the list of addresses based at least in part on a cleaning pointer that reflects the position. In some examples, determining to clean the memory block may be based at least in part on the obtained address.

In some examples, the determination component 825 may be configured as or otherwise support a means for determining a third position in the list of addresses upon setting the value of the flag to the obtained value. In some examples, the list writer 865 may be configured as or otherwise support a means for updating, based at least in part on cleaning the memory block, the cleaning pointer to reflect a second position in the list of addresses. In some examples, the determination component 825 may be configured as or otherwise support a means for determining, after updating the cleaning pointer, whether the cleaning pointer reflects the determined third position in the list of addresses. In some examples, the peripheral writer 855 may be configured as or otherwise support a means for changing the value of the flag to correspond to the first type of write operation, the changing based at least in part on determining that the cleaning pointer reflects the determined third position.

The command receiver 845 may be configured as or otherwise support a means for receiving a write command associated with a set of data. The memory block writer 850 may be configured as or otherwise support a means for writing the data to a memory block in response to the write command, the memory block included in a set of memory blocks each including a respective set of memory cells. The peripheral writer 855 may be configured as or otherwise support a means for incrementing a value of a counter based at least in part on writing the data to the memory block. In some examples, the peripheral writer 855 may be configured as or otherwise support a means for setting a value of a flag based at least in part on the incrementing causing the value of the counter to satisfy a threshold, where the value of the flag may indicate a type of write operation for cleaning one or more memory blocks of the set of memory blocks. In some examples, the peripheral writer 855 may be configured as or otherwise support a means for resetting the value of the counter based at least in part on setting the value of the flag.

In some examples, the list reader 860 may be configured as or otherwise support a means for obtaining, in response to the write command, an address of the memory block from a list of addresses that may include a respective address for each memory block in the set of memory blocks, where the threshold may be based at least in part on a quantity of available addresses within the list of addresses. In some examples, the quantity of available addresses within the list of addresses may include a quantity of addresses within the list of addresses that may be associated with memory blocks that are available to store new data.

In some examples, to support obtaining the address of the memory block from the list of addresses, the list reader 860 may be configured as or otherwise support a means for obtaining the address of the memory block from a position in the list of addresses based at least in part on a write pointer that reflects the position.

In some examples, the list reader 860 may be configured as or otherwise support a means for obtaining, in response to the write command, an address of the memory block from a list of addresses that may include a respective address for each memory block in the set of memory blocks. In some examples, the list reader 860 may be configured as or otherwise support a means for identifying a second address of a second memory block after setting the value of the flag, the second address included in the list of addresses. In some examples, the selection component 835 may be configured as or otherwise support a means for selecting a type of write operation for cleaning the second memory block based at least in part on the value of the flag, the type being selected from among a set of types that may include a first type of write operation and a second type of write operation. In some examples, the memory block cleaner 840 may be configured as or otherwise support a means for cleaning the second memory block using the selected type of write operation.

In some examples, to support identifying the second address, the list reader 860 may be configured as or otherwise support a means for obtaining the second address from a position in the list of addresses based at least in part on a cleaning pointer that reflects the position. In some examples, the determination component 825 may be configured as or otherwise support a means for selecting the second memory block for cleaning based at least in part on the obtained second address.

In some examples, the determination component 825 may be configured as or otherwise support a means for determining a third position in the list of addresses upon setting the flag. In some examples, the list writer 865 may be configured as or otherwise support a means for updating, based at least in part on cleaning the second memory block, the cleaning pointer to reflect a second position in the list of addresses. In some examples, the determination component 825 may be configured as or otherwise support a means for determining, after updating the cleaning pointer, whether the cleaning pointer reflects the determined third position in the list of addresses. In some examples, the peripheral writer 855 may be configured as or otherwise support a means for resetting the value of the flag based at least in part on determining that the cleaning pointer reflects the determined third position in the list of addresses.

In some examples, to support obtaining the address of the memory block, the list reader 860 may be configured as or otherwise support a means for obtaining a first address from a first position in the list of addresses based at least in part on a write pointer that reflects the first position.

In some examples, to support identifying the second address, the list reader 860 may be configured as or otherwise support a means for obtaining the second address from a second position in the list of addresses based at least in part on a cleaning pointer that reflects the second position.

In some examples, the threshold may be based at least in part on a quantity of positions in the list of addresses between the first position and a second position in the list of addresses, the second position reflected by an end-of-list pointer.

The list reader 860 may be configured as or otherwise support a means for obtaining a first address of a first memory block from a list of addresses of a set of memory blocks, the memory blocks each including a set of memory cells, where the first address may be obtained from a first position in the list of addresses based at least in part on a first pointer that reflects the first position. In some examples, the memory block cleaner 840 may be configured as or otherwise support a means for cleaning the first memory block using a first type of write operation based at least in part on a flag not being set. The list writer 865 may be configured as or otherwise support a means for incrementing, after cleaning the first memory block, the first pointer to reflect a next position in the list of addresses. In some examples, the peripheral writer 855 may be configured as or otherwise support a means for setting the flag after cleaning the first memory block. In some examples, the memory block cleaner 840 may be configured as or otherwise support a means for cleaning a subset of memory blocks using a second type of write operation based at least in part on the flag being set, the subset of memory blocks having addresses that are positioned in the list of addresses between the next position reflected by the first pointer and a second position reflected by a second pointer. In some examples, the peripheral writer 855 may be configured as or otherwise support a means for resetting the flag based at least in part on completion of the cleaning of the subset of memory blocks.

In some examples, the list writer 865 may be configured as or otherwise support a means for updating, after resetting the flag, the first pointer to reflect a third position in the list of addresses. In some examples, the list writer 865 may be configured as or otherwise support a means for obtaining a second address from the third position in the list of addresses, where the second address may be obtained from the third position based at least in part on the first pointer reflecting the third position. In some examples, the memory block cleaner 840 may be configured as or otherwise support a means for cleaning a second memory block associated with the second address using the first type of write operation, where using the first type of write operation may be based at least in part on the flag being reset.

In some examples, to support cleaning the first memory block, the memory block cleaner 840 may be configured as or otherwise support a means for identifying, within the set of memory cells of the first memory block, a first subset of memory cells that may each be in a first state. In some examples, to support cleaning the first memory block, the memory block cleaner 840 may be configured as or otherwise support a means for identifying within the set of memory cells of the first memory block, a second subset of memory cells of the first memory block that may each be in the second state. In some examples, to support cleaning the first memory block, the memory block cleaner 840 may be configured as or otherwise support a means for writing each memory cell within the first subset of memory cells to a second state. In some examples, to support cleaning the first memory block, the memory block cleaner 840 may be configured as or otherwise support a means for refraining from writing each memory cell within the second subset of memory cells.

In some examples, to support cleaning the first memory block, the memory block cleaner 840 may be configured as or otherwise support a means for applying a first pulse having a first polarity to each memory cell within the set of memory cells of the first memory block.

In some examples, to support writing each memory cell within the subset of memory cells to the second state, the memory block cleaner 840 may be configured as or otherwise support a means for applying a second pulse having a second polarity to each memory cell within the subset of memory cells.

In some examples, identifying the subset of memory cells may be based at least in part on applying the first pulse.

In some examples, to support cleaning the subset of memory blocks using the second type of write operation, the memory block cleaner 840 may be configured as or otherwise support a means for writing, for each memory block of the subset of memory blocks, each memory cell within the memory block to a second state regardless of whether the memory cell was already in the second state before the writing.

In some examples, to support cleaning the subset of memory blocks using the second type of write operation, the memory block cleaner 840 may be configured as or otherwise support a means for applying, for each memory block of the subset of memory blocks, a first pulse having a first polarity to each memory cell within the memory block.

In some examples, to support writing each memory cell within the memory block, the memory block cleaner 840 may be configured as or otherwise support a means for applying a second pulse having a second polarity different than the first polarity to each memory cell within the memory block.

In some examples, the determination component 825 may be configured as or otherwise support a means for determining a third position in the list of addresses upon setting the flag.

In some examples, to support, for each memory block of the subset of memory blocks, cleaning the subset of memory blocks, the memory block cleaner 840 may be configured as or otherwise support a means for cleaning the memory block reflected by the first pointer using the second type of write operation. In some examples, to support, for each memory block of the subset of memory blocks, cleaning the subset of memory blocks, the list writer 865 may be configured as or otherwise support a means for updating the first pointer to reflect the next position in the list of addresses. In some examples, to support, for each memory block of the subset of memory blocks, cleaning the subset of memory blocks, the determination component 825 may be configured as or otherwise support a means for determining whether the first pointer reflects the third position in the list of addresses.

Figure 9:
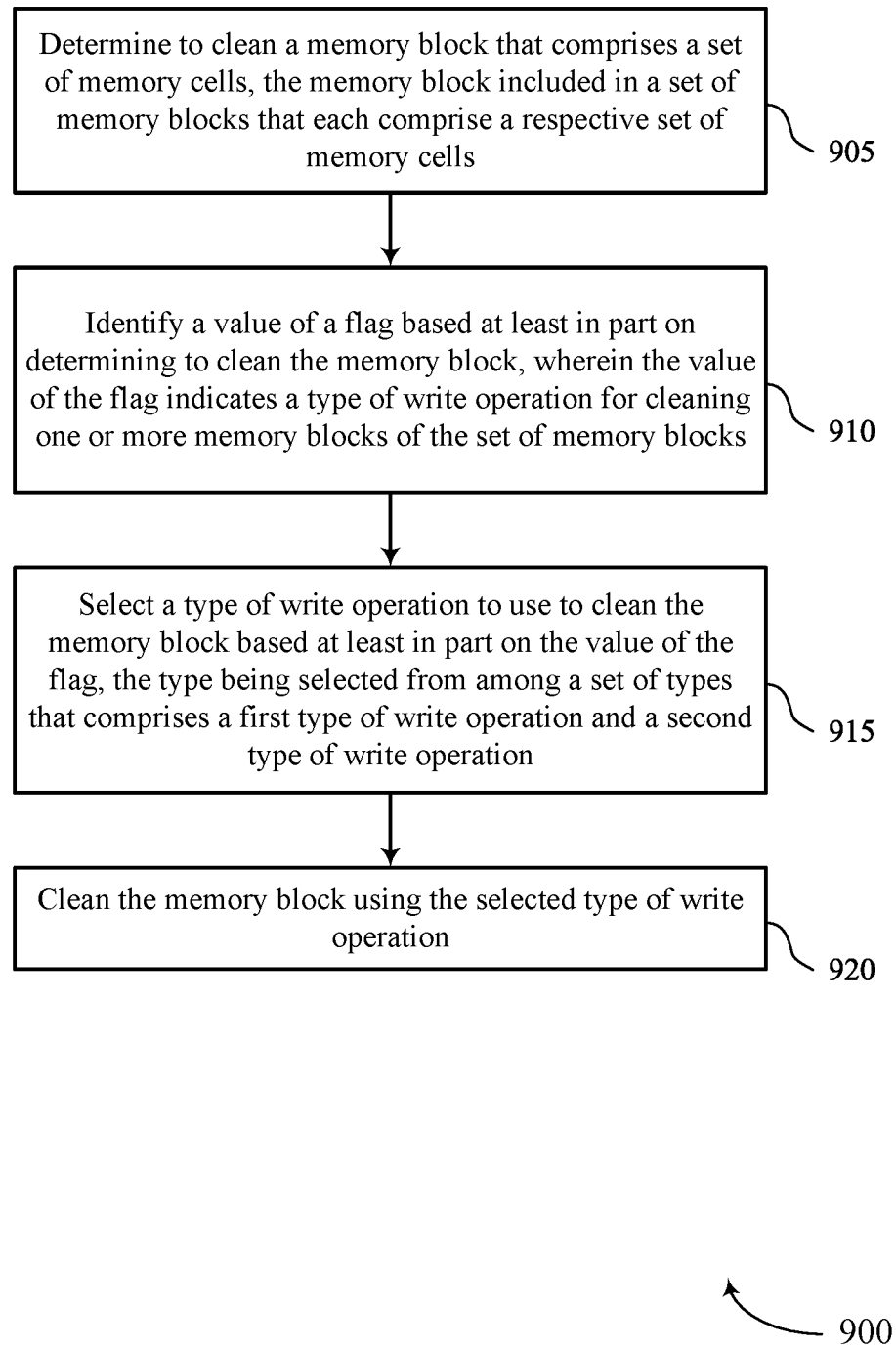
FIGS. 9 through 11 show flowcharts illustrating methods that support cleaning memory blocks using multiple types of write operations in accordance with examples as disclosed herein.

FIG. 9 shows a flowchart illustrating a method 900 that supports cleaning memory blocks using multiple types of write operations in accordance with examples as disclosed herein. The operations of method 900 may be implemented by a memory system or its components as described herein. For example, the operations of method 900 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 905, the method may include determining to clean a memory block that includes a set of memory cells, the memory block included in a set of memory blocks that each include a respective set of memory cells. The operations of 905 may be performed in accordance with examples as disclosed herein. In some examples, aspects of the operations of 905 may be performed by a determination component 825 as described with reference to FIG. 8.

At 910, the method may include identifying a value of a flag based at least in part on determining to clean the memory block, where the value of the flag indicates a type of write operation for cleaning one or more memory blocks of the set of memory blocks. The operations of 910 may be performed in accordance with examples as disclosed herein. In some examples, aspects of the operations of 910 may be performed by a peripheral reader 830 as described with reference to FIG. 8.

At 915, the method may include selecting a type of write operation to use to clean the memory block based at least in part on the value of the flag, the type being selected from among a set of types that includes a first type of write operation and a second type of write operation. The operations of 915 may be performed in accordance with examples as disclosed herein. In some examples, aspects of the operations of 915 may be performed by a selection component 835 as described with reference to FIG. 8.

At 920, the method may include cleaning the memory block using the selected type of write operation. The operations of 920 may be performed in accordance with examples as disclosed herein. In some examples, aspects of the operations of 920 may be performed by a memory block cleaner 840 as described with reference to FIG. 8.

In some examples, an apparatus as described herein may perform a method or methods, such as the method 900. The apparatus may include, features, circuitry, logic, means, or instructions (e.g., a non-transitory computer-readable medium storing instructions executable by a processor) for determining to clean a memory block that includes a set of memory cells, the memory block included in a set of memory blocks that each include a respective set of memory cells, identifying a value of a flag based at least in part on determining to clean the memory block, where the value of the flag indicates a type of write operation for cleaning one or more memory blocks of the set of memory blocks, selecting a type of write operation to use to clean the memory block based at least in part on the value of the flag, the type being selected from among a set of types that includes a first type of write operation and a second type of write operation, and cleaning the memory block using the selected type of write operation.

Some examples of the method 900 and the apparatus described herein may further include operations, features, circuitry, logic, means, or instructions for cleaning the memory block results in each memory cell within the memory block being in the same state and the memory block may be available to store new data based at least in part on being cleaned.

In some examples of the method 900 and the apparatus described herein, selecting the type of write operation may include operations, features, circuitry, logic, means, or instructions for selecting the first type of write operation.

In some examples of the method 900 and the apparatus described herein, cleaning the memory block may include operations, features, circuitry, logic, means, or instructions for identifying, within the set of memory cells, a subset of memory cells that may be each in a first state and writing each memory cell within the subset of memory cells to a second state.

In some examples of the method 900 and the apparatus described herein, cleaning the memory block may include operations, features, circuitry, logic, means, or instructions for applying a first pulse having a first polarity to the set of memory cells.

In some examples of the method 900 and the apparatus described herein, writing each memory cell within the subset of memory cells to the second state may include operations, features, circuitry, logic, means, or instructions for applying a second pulse having a second polarity to each memory cell within the subset of memory cells.

Some examples of the method 900 and the apparatus described herein may further include operations, features, circuitry, logic, means, or instructions for identifying the subset of memory cells may be based at least in part on applying the first pulse.

In some examples of the method 900 and the apparatus described herein, cleaning the memory block may include operations, features, circuitry, logic, means, or instructions for identifying within the set of memory cells, a second subset of memory cells that may be each in the second state and refraining from writing each memory cell within the second subset of memory cells.

In some examples of the method 900 and the apparatus described herein, selecting the type of write operation may include operations, features, circuitry, logic, means, or instructions for selecting the second type of write operation.

Some examples of the method 900 and the apparatus described herein may further include operations, features, circuitry, logic, means, or instructions for changing, after the cleaning of the memory block, the value of the flag to correspond to the first type of write operation.

In some examples of the method 900 and the apparatus described herein, selecting the type of write operation may include operations, features, circuitry, logic, means, or instructions for selecting the second type of write operation.

In some examples of the method 900 and the apparatus described herein, cleaning the memory block may include operations, features, circuitry, logic, means, or instructions for writing each memory cell within the set of memory cells to a second state regardless of whether the memory cell was already in the second state before the writing.

In some examples of the method 900 and the apparatus described herein, cleaning the memory block may include operations, features, circuitry, logic, means, or instructions for applying a first pulse having a first polarity to each memory cell within the set of memory cells.

In some examples of the method 900 and the apparatus described herein, writing each memory cell of the set of memory cells to a second state may include operations, features, circuitry, logic, means, or instructions for applying a second pulse to each memory cell within the subset of memory cells after applying the first pulse, the second pulse having a second polarity different than the first polarity.

Some examples of the method 900 and the apparatus described herein may further include operations, features, circuitry, logic, means, or instructions for obtaining an address of the memory block from a list of addresses of memory blocks.

In some examples of the method 900 and the apparatus described herein, the address may be obtained from a position in the list of addresses based at least in part on a cleaning pointer that reflects the position.

Some examples of the method 900 and the apparatus described herein may further include operations, features, circuitry, logic, means, or instructions for determining to clean the memory block may be based at least in part on the obtained address.

Some examples of the method 900 and the apparatus described herein may further include operations, features, circuitry, logic, means, or instructions for determining a third position in the list of addresses upon setting the value of the flag to the obtained value, updating, based at least in part on cleaning the memory block, the cleaning pointer to reflect a second position in the list of addresses, determining, after updating the cleaning pointer, whether the cleaning pointer reflects the determined third position in the list of addresses, and changing the value of the flag to correspond to the first type of write operation, the changing based at least in part on determining that the cleaning pointer reflects the determined third position.

Figure 10:
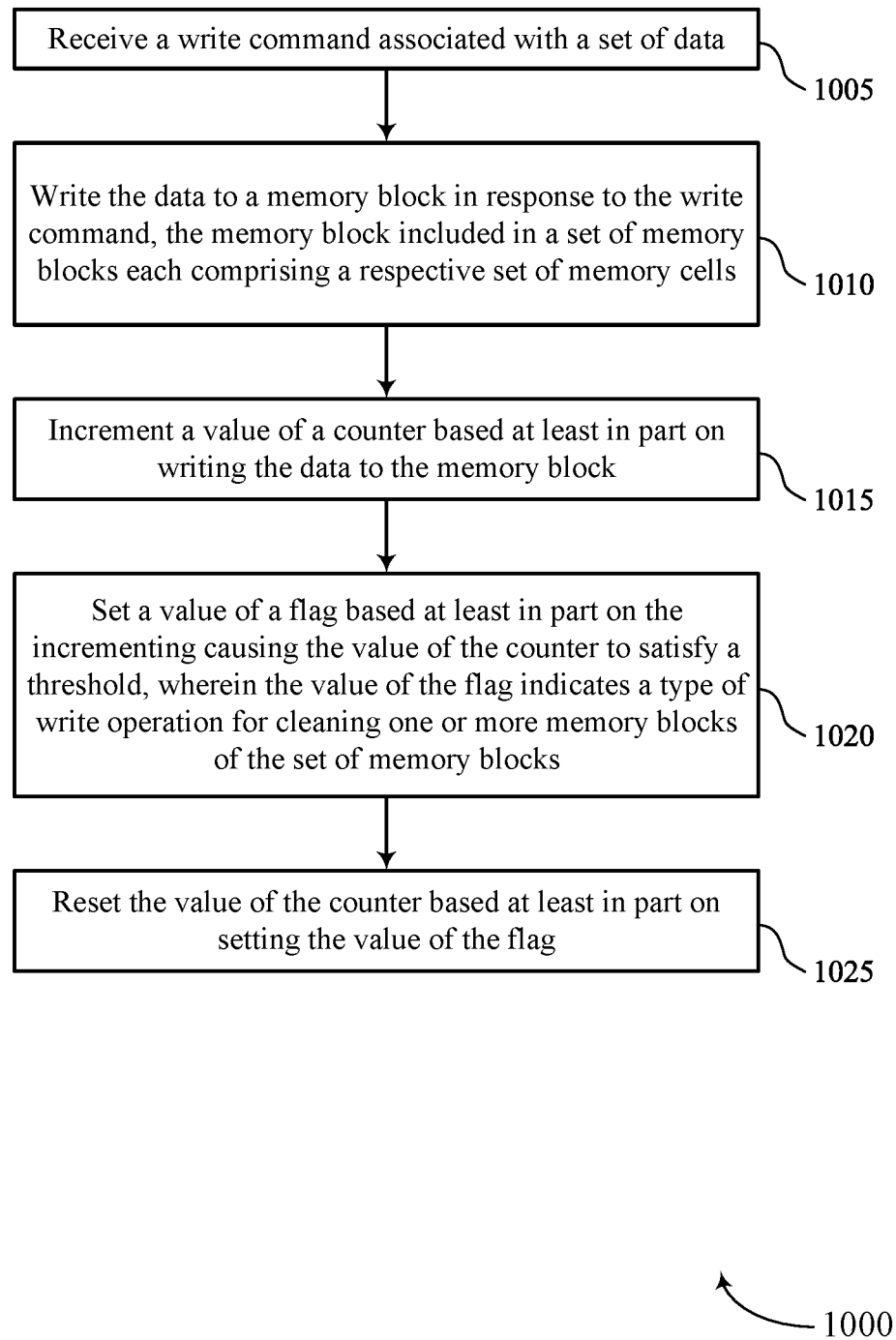

FIG. 10 shows a flowchart illustrating a method 1000 that supports cleaning memory blocks using multiple types of write operations in accordance with examples as disclosed herein. The operations of method 1000 may be implemented by a memory system or its components as described herein. For example, the operations of method 1000 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 1005, the method may include receiving a write command associated with a set of data. The operations of 1005 may be performed in accordance with examples as disclosed herein. In some examples, aspects of the operations of 1005 may be performed by a command receiver 845 as described with reference to FIG. 8.

At 1010, the method may include writing the data to a memory block in response to the write command, the memory block included in a set of memory blocks each including a respective set of memory cells. The operations of 1010 may be performed in accordance with examples as disclosed herein. In some examples, aspects of the operations of 1010 may be performed by a memory block writer 850 as described with reference to FIG. 8.

At 1015, the method may include incrementing a value of a counter based at least in part on writing the data to the memory block. The operations of 1015 may be performed in accordance with examples as disclosed herein. In some examples, aspects of the operations of 1015 may be performed by a peripheral writer 855 as described with reference to FIG. 8.

At 1020, the method may include setting a value of a flag based at least in part on the incrementing causing the value of the counter to satisfy a threshold, where the value of the flag indicates a type of write operation for cleaning one or more memory blocks of the set of memory blocks. The operations of 1020 may be performed in accordance with examples as disclosed herein. In some examples, aspects of the operations of 1020 may be performed by a peripheral writer 855 as described with reference to FIG. 8.

At 1025, the method may include resetting the value of the counter based at least in part on setting the value of the flag. The operations of 1025 may be performed in accordance with examples as disclosed herein. In some examples, aspects of the operations of 1025 may be performed by a peripheral writer 855 as described with reference to FIG. 8.

In some examples, an apparatus as described herein may perform a method or methods, such as the method 1000. The apparatus may include, features, circuitry, logic, means, or instructions (e.g., a non-transitory computer-readable medium storing instructions executable by a processor) for receiving a write command associated with a set of data, writing the data to a memory block in response to the write command, the memory block included in a set of memory blocks each including a respective set of memory cells, incrementing a value of a counter based at least in part on writing the data to the memory block, setting a value of a flag based at least in part on the incrementing causing the value of the counter to satisfy a threshold, where the value of the flag indicates a type of write operation for cleaning one or more memory blocks of the set of memory blocks, and resetting the value of the counter based at least in part on setting the value of the flag.

Some examples of the method 1000 and the apparatus described herein may further include operations, features, circuitry, logic, means, or instructions for obtaining, in response to the write command, an address of the memory block from a list of addresses that includes a respective address for each memory block in the set of memory blocks, where the threshold may be based at least in part on a quantity of available addresses within the list of addresses.

In some examples of the method 1000 and the apparatus described herein, the quantity of available addresses within the list of addresses includes a quantity of addresses within the list of addresses that may be associated with memory blocks that may be available to store new data.

In some examples of the method 1000 and the apparatus described herein, obtaining the address of the memory block from the list of addresses may include operations, features, circuitry, logic, means, or instructions for obtaining the address of the memory block from a position in the list of addresses based at least in part on a write pointer that reflects the position.

Some examples of the method 1000 and the apparatus described herein may further include operations, features, circuitry, logic, means, or instructions for obtaining, in response to the write command, an address of the memory block from a list of addresses that includes a respective address for each memory block in the set of memory blocks, identifying a second address of a second memory block after setting the value of the flag, the second address included in the list of addresses, selecting a type of write operation for cleaning the second memory block based at least in part on the value of the flag, the type being selected from among a set of types that includes a first type of write operation and a second type of write operation, and cleaning the second memory block using the selected type of write operation.

In some examples of the method 1000 and the apparatus described herein, identifying the second address may include operations, features, circuitry, logic, means, or instructions for obtaining the second address from a position in the list of addresses based at least in part on a cleaning pointer that reflects the position.

Some examples of the method 1000 and the apparatus described herein may further include operations, features, circuitry, logic, means, or instructions for selecting the second memory block for cleaning based at least in part on the obtained second address.

Some examples of the method 1000 and the apparatus described herein may further include operations, features, circuitry, logic, means, or instructions for determining a third position in the list of addresses upon setting the flag, updating, based at least in part on cleaning the second memory block, the cleaning pointer to reflect a second position in the list of addresses, determining, after updating the cleaning pointer, whether the cleaning pointer reflects the determined third position in the list of addresses, and resetting the value of the flag based at least in part on determining that the cleaning pointer reflects the determined third position in the list of addresses.

In some examples of the method 1000 and the apparatus described herein, obtaining the address of the memory block may include operations, features, circuitry, logic, means, or instructions for obtaining a first address from a first position in the list of addresses based at least in part on a write pointer that reflects the first position.

In some examples of the method 1000 and the apparatus described herein, identifying the second address may include operations, features, circuitry, logic, means, or instructions for obtaining the second address from a second position in the list of addresses based at least in part on a cleaning pointer that reflects the second position.

In some examples of the method 1000 and the apparatus described herein, the threshold may be based at least in part on a quantity of positions in the list of addresses between the first position and a second position in the list of addresses, the second position reflected by an end-of-list pointer.

Figure 11:
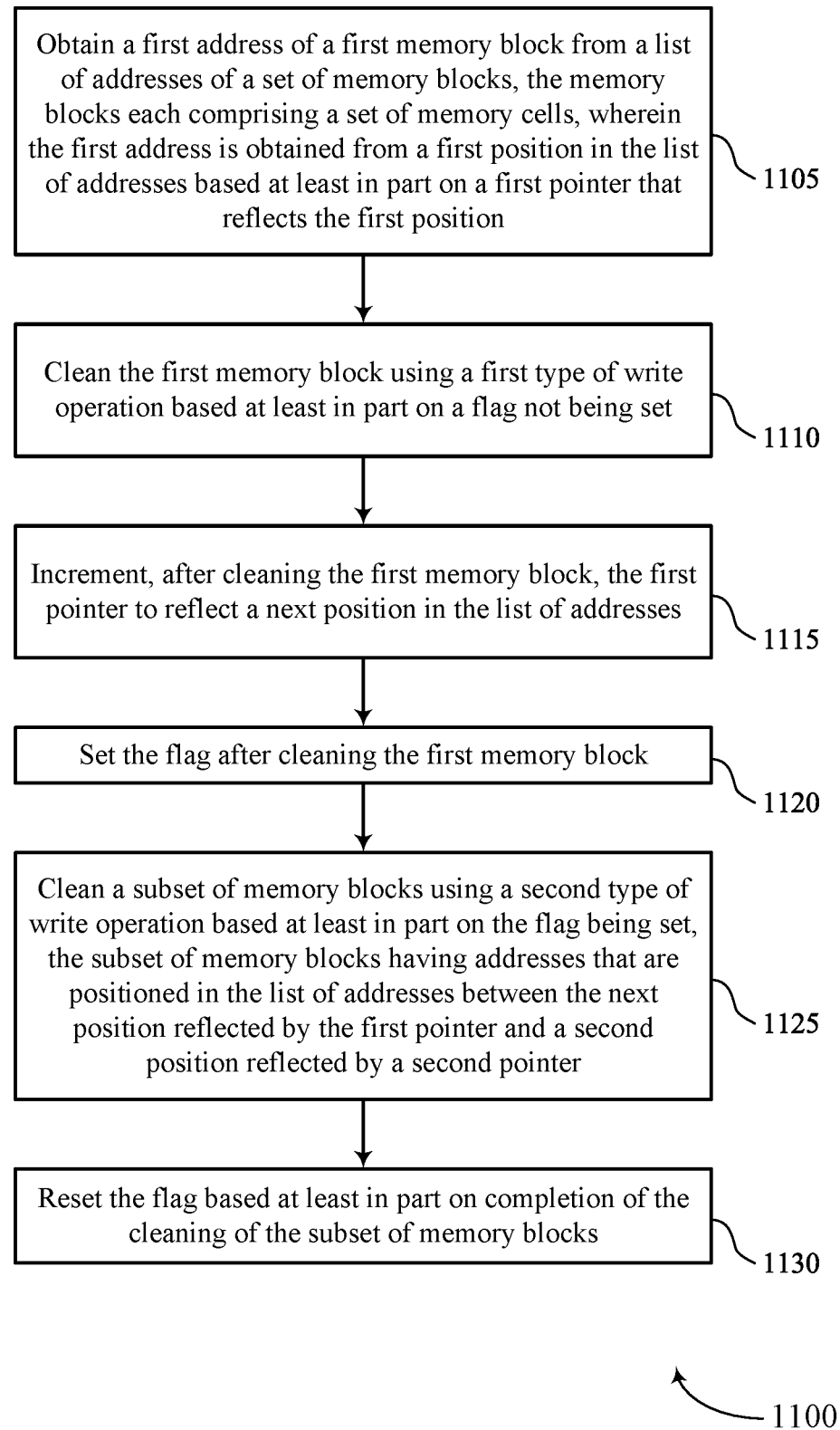

FIG. 11 shows a flowchart illustrating a method 1100 that supports cleaning memory blocks using multiple types of write operations in accordance with examples as disclosed herein. The operations of method 1100 may be implemented by a memory system or its components as described herein. For example, the operations of method 1100 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 1105, the method may include obtaining a first address of a first memory block from a list of addresses of a set of memory blocks, the memory blocks each including a set of memory cells, where the first address is obtained from a first position in the list of addresses based at least in part on a first pointer that reflects the first position. The operations of 1105 may be performed in accordance with examples as disclosed herein. In some examples, aspects of the operations of 1105 may be performed by a list reader 860 as described with reference to FIG. 8.

At 1110, the method may include cleaning the first memory block using a first type of write operation based at least in part on a flag not being set. The operations of 1110 may be performed in accordance with examples as disclosed herein. In some examples, aspects of the operations of 1110 may be performed by a memory block cleaner 840 as described with reference to FIG. 8.

At 1115, the method may include incrementing, after cleaning the first memory block, the first pointer to reflect a next position in the list of addresses. The operations of 1115 may be performed in accordance with examples as disclosed herein. In some examples, aspects of the operations of 1115 may be performed by a list writer 865 as described with reference to FIG. 8.

At 1120, the method may include setting the flag after cleaning the first memory block. The operations of 1120 may be performed in accordance with examples as disclosed herein. In some examples, aspects of the operations of 1120 may be performed by a peripheral writer 855 as described with reference to FIG. 8.

At 1125, the method may include cleaning a subset of memory blocks using a second type of write operation based at least in part on the flag being set, the subset of memory blocks having addresses that are positioned in the list of addresses between the next position reflected by the first pointer and a second position reflected by a second pointer. The operations of 1125 may be performed in accordance with examples as disclosed herein. In some examples, aspects of the operations of 1125 may be performed by a memory block cleaner 840 as described with reference to FIG. 8.

At 1130, the method may include resetting the flag based at least in part on completion of the cleaning of the subset of memory blocks. The operations of 1130 may be performed in accordance with examples as disclosed herein. In some examples, aspects of the operations of 1130 may be performed by a peripheral writer 855 as described with reference to FIG. 8.

In some examples, an apparatus as described herein may perform a method or methods, such as the method 1100. The apparatus may include, features, circuitry, logic, means, or instructions (e.g., a non-transitory computer-readable medium storing instructions executable by a processor) for obtaining a first address of a first memory block from a list of addresses of a set of memory blocks, the memory blocks each including a set of memory cells, where the first address is obtained from a first position in the list of addresses based at least in part on a first pointer that reflects the first position, cleaning the first memory block using a first type of write operation based at least in part on a flag not being set, incrementing, after cleaning the first memory block, the first pointer to reflect a next position in the list of addresses, setting the flag after cleaning the first memory block, cleaning a subset of memory blocks using a second type of write operation based at least in part on the flag being set, the subset of memory blocks having addresses that are positioned in the list of addresses between the next position reflected by the first pointer and a second position reflected by a second pointer, and resetting the flag based at least in part on completion of the cleaning of the subset of memory blocks.

Some examples of the method 1100 and the apparatus described herein may further include operations, features, circuitry, logic, means, or instructions for updating, after resetting the flag, the first pointer to reflect a third position in the list of addresses, obtaining a second address from the third position in the list of addresses, where the second address may be obtained from the third position based at least in part on the first pointer reflecting the third position, and cleaning a second memory block associated with the second address using the first type of write operation, where using the first type of write operation may be based at least in part on the flag being reset.

In some examples of the method 1100 and the apparatus described herein, cleaning the first memory block may include operations, features, circuitry, logic, means, or instructions for identifying, within the set of memory cells of the first memory block, a first subset of memory cells that may be each in a first state, identifying within the set of memory cells of the first memory block, a second subset of memory cells of the first memory block that may be each in the second state, writing each memory cell within the first subset of memory cells to a second state, and refraining from writing each memory cell within the second subset of memory cells.

In some examples of the method 1100 and the apparatus described herein, cleaning the first memory block may include operations, features, circuitry, logic, means, or instructions for applying a first pulse having a first polarity to each memory cell within the set of memory cells of the first memory block.

In some examples of the method 1100 and the apparatus described herein, writing each memory cell within the subset of memory cells to the second state may include operations, features, circuitry, logic, means, or instructions for applying a second pulse having a second polarity to each memory cell within the subset of memory cells.

Some examples of the method 1100 and the apparatus described herein may further include operations, features, circuitry, logic, means, or instructions for identifying the subset of memory cells may be based at least in part on applying the first pulse.

In some examples of the method 1100 and the apparatus described herein, cleaning the subset of memory blocks using the second type of write operation may include operations, features, circuitry, logic, means, or instructions for writing, for each memory block of the subset of memory blocks, each memory cell within the memory block to a second state regardless of whether the memory cell was already in the second state before the writing.

In some examples of the method 1100 and the apparatus described herein, cleaning the subset of memory blocks using the second type of write operation may include operations, features, circuitry, logic, means, or instructions for applying, for each memory block of the subset of memory blocks, a first pulse having a first polarity to each memory cell within the memory block.

In some examples of the method 1100 and the apparatus described herein, writing each memory cell within the memory block may include operations, features, circuitry, logic, means, or instructions for applying a second pulse having a second polarity different than the first polarity to each memory cell within the memory block.

Some examples of the method 1100 and the apparatus described herein may further include operations, features, circuitry, logic, means, or instructions for determining a third position in the list of addresses upon setting the flag.

In some examples of the method 1100 and the apparatus described herein, for each memory block of the subset of memory blocks, cleaning the subset of memory blocks may include operations, features, circuitry, logic, means, or instructions for cleaning the memory block reflected by the first pointer using the second type of write operation, updating the first pointer to reflect the next position in the list of addresses, and determining whether the first pointer reflects the third position in the list of addresses.

It should be noted that the methods described herein describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a set of memory blocks that each comprise a respective set of memory cells; and
a controller coupled with the set of memory blocks and configured to cause the apparatus to:
determine to clean a memory block that comprises a set of memory cells, the memory block included in a set of memory blocks that each comprise a respective set of memory cells;
identify a value of a flag based at least in part on determining to clean the memory block, wherein the value of the flag indicates a type of write operation for cleaning one or more memory blocks of the set of memory blocks;
select a type of write operation to use to clean the memory block based at least in part on the value of the flag, the type being selected from among a set of types that comprises a first type of write operation and a second type of write operation; and
clean the memory block using the selected type of write operation.

2. The apparatus of claim 1, wherein the controller is configured to cause the apparatus to:
clean the memory block based at least in part on writing one or more memory cells such that each memory cell within the memory block is in a same state; and
classify the memory block as available to store new data based at least in part on the memory block being cleaned.

3. The apparatus of claim 1, wherein:
in response to the selected the type of write operation being the first type of write operation, to clean the memory block using the first type of write operation, the controller is configured to cause the apparatus to:
identify, within the set of memory cells, a subset of memory cells that are each in a first state; and
write each memory cell within the subset of memory cells to a second state.

4. The apparatus of claim 3, wherein:
to clean the memory block using the first type of write operation, the controller is configured to cause the apparatus to apply a first pulse having a first polarity to the set of memory cells;
to write each memory cell within the subset of memory cells to the second state, the controller is configured to cause the apparatus to apply a second pulse having a second polarity to each memory cell within the subset of memory cells; and
the controller is configured to cause the apparatus to identify the subset of memory cells is based at least in part on applying the first pulse.

5. The apparatus of claim 3, wherein, to clean the memory block using the first type of write operation, the controller is configured to cause the apparatus to:
identify within the set of memory cells, a second subset of memory cells that are each in the second state; and
refrain from writing each memory cell within the second subset of memory cells.

6. The apparatus of claim 1, wherein:
in response to the selected the type of write operation being the second type of write operation, the controller is configured to cause the apparatus to:
change, after the cleaning of the memory block, the value of the flag to correspond to the first type of write operation.

7. The apparatus of claim 1, wherein:
in response to the selected the type of write operation being the second type of write operation, to clean the memory block using the second type of write operation, the controller is configured to cause the apparatus to:
write each memory cell within the set of memory cells to a second state regardless of whether the memory cell was already in the second state before the writing.

8. The apparatus of claim 7, wherein, to clean the memory block using the second type of write operation, the controller is configured to cause the apparatus to:
apply a first pulse having a first polarity to each memory cell within the set of memory cells; and
write each memory cell of the set of memory cells to a second state comprises applying a second pulse to each memory cell within the set of memory cells after applying the first pulse, the second pulse having a second polarity different than the first polarity.

9. The apparatus of claim 1, wherein the controller is configured to cause the apparatus to:
obtain an address of the memory block from a list of addresses of memory blocks based at least in part on a cleaning pointer that reflects a position in the list of addresses, and wherein determining to clean the memory block is based at least in part on the obtained address.

10. The apparatus of claim 9, wherein the controller is configured to cause the apparatus to:
determine a third position in the list of addresses upon setting the value of the flag to the obtained address;
update, based at least in part on cleaning the memory block, the cleaning pointer to reflect a second position in the list of addresses;
determine, after updating the cleaning pointer, whether the cleaning pointer reflects the determined third position in the list of addresses; and
change the value of the flag to correspond to the first type of write operation, based at least in part on determining that the cleaning pointer reflects the determined third position.

11. An apparatus, comprising:
a set of memory blocks that each comprise a respective set of memory cells; and
a controller coupled with the set of memory blocks and configured to cause the apparatus to:
receive a write command associated with a set of data;
write the data to a memory block in response to the write command, the memory block included in the set of memory blocks;
increment a value of a counter based at least in part on writing the data to the memory block;
set a value of a flag in response to the incremented value of the counter satisfying a threshold, wherein the value of the flag indicates a type of write operation for cleaning one or more memory blocks of the set of memory blocks; and
reset the value of the counter based at least in part on setting the value of the flag.

12. The apparatus of claim 11, wherein the controller is configured to cause the apparatus to:
obtain, in response to the write command, an address of the memory block from a list of addresses that comprises a respective address for each memory block in the set of memory blocks, wherein the threshold is based at least in part on a quantity of available addresses within the list of addresses.

13. The apparatus of claim 12, wherein the quantity of available addresses within the list of addresses comprises a quantity of addresses within the list of addresses that are associated with memory blocks that are available to store new data.

14. The apparatus of claim 12, wherein the controller is configured to cause the apparatus to:
obtain the address of the memory block from a position in the list of addresses based at least in part on a write pointer that reflects the position.

15. The apparatus of claim 11, wherein the controller is configured to cause the apparatus to:
obtain, in response to the write command, an address of the memory block from a list of addresses that comprises a respective address for each memory block in the set of memory blocks;
identify a second address of a second memory block after setting the value of the flag, the second address included in the list of addresses;
select a type of write operation for cleaning the second memory block based at least in part on the value of the flag, the type being selected from among a set of types that comprises a first type of write operation and a second type of write operation; and
clean the second memory block using the selected type of write operation.

16. The apparatus of claim 15, wherein:
to identify the second address, the controller is configured to cause the apparatus to obtain the second address from a position in the list of addresses based at least in part on a cleaning pointer that reflects the position; and
the controller is configured to cause the apparatus to select the second memory block for cleaning based at least in part on the obtained second address.

17. The apparatus of claim 16, wherein the controller is configured to cause the apparatus to:
determine a third position in the list of addresses upon setting the flag;
update, based at least in part on cleaning the second memory block, the cleaning pointer to reflect a second position in the list of addresses;
determine, after updating the cleaning pointer, whether the cleaning pointer reflects the determined third position in the list of addresses; and
reset the value of the flag based at least in part on determining that the cleaning pointer reflects the determined third position in the list of addresses.

18. The apparatus of claim 15, wherein:
the controller is configured to cause the apparatus to obtain the address of the memory block from a first position in the list of addresses based at least in part on a write pointer that reflects the first position; and
the threshold is based at least in part on a quantity of positions in the list of addresses between the first position and a second position in the list of addresses, the second position reflected by an end-of-list pointer.

19. An apparatus, comprising:
a set of memory blocks that each comprise a respective set of memory cells; and
a controller coupled with the set of memory blocks and configured to cause the apparatus to:
obtain a first address of a first memory block from a list of addresses corresponding to the set of memory blocks, wherein the first address is obtained from a first position in the list of addresses based at least in part on a first pointer that reflects the first position;

clean the first memory block using a first type of write operation based at least in part on a flag not being set;

increment, after cleaning the first memory block, the first pointer to reflect a next position in the list of addresses;

set the flag after cleaning the first memory block;

clean a subset of memory blocks using a second type of write operation based at least in part on the flag being set, the subset of memory blocks having addresses that are positioned in the list of addresses between the next position reflected by the first pointer and a second position reflected by a second pointer; and reset the flag based at least in part on completion of the cleaning of the subset of memory blocks.

20. The apparatus of claim 19, wherein the controller is configured to cause the apparatus to:

update, after resetting the flag, the first pointer to reflect a third position in the list of addresses;

obtain a second address from the third position in the list of addresses based at least in part on the first pointer reflecting the third position; and clean a second memory block associated with the second address using the first type of write operation, wherein using the first type of write operation is based at least in part on the flag being reset.

21. The apparatus of claim 19, wherein, to clean the first memory block using the first type of write operation, the controller is configured to cause the apparatus to:

identify, within the set of memory cells of the first memory block, a first subset of memory cells that are each in a first state;

identify within the set of memory cells of the first memory block, a second subset of memory cells of the first memory block that are each in the second state;

write each memory cell within the first subset of memory cells to a second state; and refrain from writing each memory cell within the second subset of memory cells.

22. The apparatus of claim 21, wherein:

to clean the first memory block using the first type of write operation, the controller is configured to cause the apparatus to apply a first pulse having a first polarity to each memory cell within the set of memory cells of the first memory block;

to write each memory cell within the subset of memory cells to the second state, the controller is configured to cause the apparatus to apply a second pulse having a second polarity to each memory cell within the subset of memory cells; and the controller is configured to cause the apparatus to identify the subset of memory cells based at least in part on applying the first pulse.

23. The apparatus of claim 19, wherein, to clean the subset of memory blocks using the second type of write operation, the controller is configured to cause the apparatus to:

write, for each memory block of the subset of memory blocks, each memory cell within the memory block to a second state regardless of whether the memory cell is already in the second state before the writing.

24. The apparatus of claim 23, wherein:

to clean the subset of memory blocks using the second type of write operation, the controller is configured to cause the apparatus to apply, for each memory block of the subset of memory blocks, a first pulse having a first polarity to each memory cell within the memory block; and to write each memory cell of the memory block, the controller is configured to cause the apparatus to apply a second pulse having a second polarity different than the first polarity to each memory cell within the memory block.

25. The apparatus of claim 19, wherein:

the controller is configured to cause the apparatus to determine a third position in the list of addresses upon setting the flag; and to clean the subset of memory blocks using the second type of write operation, the controller is configured to cause the apparatus to, for each memory block of the subset of memory blocks:

clean the memory block reflected by the first pointer using the second type of write operation;

update the first pointer to reflect the next position in the list of addresses; and determine whether the updated first pointer reflects the third position in the list of addresses.

* * * * *